(12) United States Patent
Odobel et al.

(10) Patent No.: US 12,410,198 B2
(45) Date of Patent: Sep. 9, 2025

(54) DERIVATIVES OF PYRROLOPYRROLE CYANINES AND USES THEREOF

(71) Applicants: CENTRE NATIONAL DE LA RECHERCHE SCIENTIFIQUE, Paris (FR); NANTES UNIVERSITE, Nantes (FR); UNIVERSITE DE PICARDIE JULES VERNE, AMIENS (FR)

(72) Inventors: Fabrice Odobel, Nantes (FR); Yann Pellegrin, Orvault (FR); Thibaut Baron, Nantes (FR); Denis Jacquemin, Nantes (FR); Fréderic Sauvage, Orival (FR); Waad Naim, Amiens (FR)

(73) Assignees: CENTRE NATIONAL DE LA RECHERCHE SCIENTIFIQUE, Paris (FR); NANTES UNIVERSITÉ, Nantes (FR); UNIVERSITE DE PICARDIE JULES VERNE, Amiens (FR)

( * ) Notice: Subject to any disclaimer, the term of this patent is extended or adjusted under 35 U.S.C. 154(b) by 139 days.

(21) Appl. No.: 18/259,567

(22) PCT Filed: Dec. 21, 2021

(86) PCT No.: PCT/EP2021/086964
§ 371 (c)(1),
(2) Date: Jun. 27, 2023

(87) PCT Pub. No.: WO2022/144228
PCT Pub. Date: Jul. 7, 2022

(65) Prior Publication Data
US 2024/0083923 A1 Mar. 14, 2024

(30) Foreign Application Priority Data
Dec. 28, 2020 (EP) .................................... 20306699

(51) Int. Cl.
*H01B 1/00* (2006.01)
*B01J 21/06* (2006.01)
(Continued)

(52) U.S. Cl.
CPC ............... *C07F 5/02* (2013.01); *B01J 21/063* (2013.01); *B01J 31/38* (2013.01); *B01J 35/19* (2024.01);
(Continued)

(58) Field of Classification Search
CPC ........... H01B 1/121; H01B 1/127; C07F 5/02; C09B 57/00; H01G 9/00; H01L 51/00
See application file for complete search history.

(56) References Cited

U.S. PATENT DOCUMENTS

| 8,303,863 B2* | 11/2012 | Nii .......................... C07F 5/02 106/311 |
| 11,407,774 B2* | 8/2022 | Hatakeyama .......... H10K 10/00 |
| 2022/0135874 A1* | 5/2022 | Miyata .................... C09B 57/00 252/301.16 |

FOREIGN PATENT DOCUMENTS

EP 2272849 A1 1/2011

OTHER PUBLICATIONS

International Search Report for PCT/EP2021/086964 mailed Feb. 8, 2022, 3 pages.
(Continued)

*Primary Examiner* — Mark Kopec
(74) *Attorney, Agent, or Firm* — NIXON & VANDERHYE

(57) ABSTRACT

Disclosed is a compound having the following formula (1):

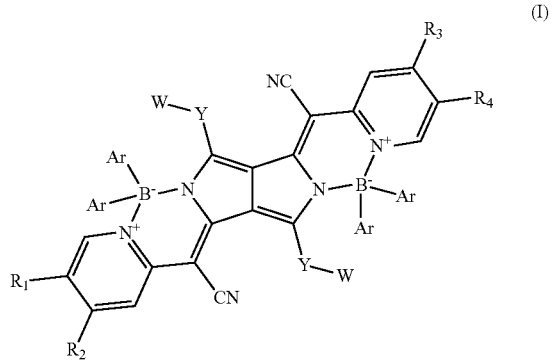

as well as to the use of such as a dye sensitizer.
Also disclosed is a dye sensitized solar cell including at least one compound of formula (I) as dye sensitizer.

13 Claims, 5 Drawing Sheets

(51) Int. Cl.
*B01J 31/38* (2006.01)
*B01J 35/00* (2006.01)
*B01J 35/39* (2024.01)
*C07F 5/02* (2006.01)
*C09B 23/01* (2006.01)
*H01B 1/12* (2006.01)
*H01G 9/00* (2006.01)
*H01G 9/20* (2006.01)
*H10K 85/30* (2023.01)
*H10K 85/60* (2023.01)

(52) U.S. Cl.
CPC ............... *B01J 35/39* (2024.01); *C07F 5/027* (2013.01); *C09B 23/0075* (2013.01); *H01B 1/121* (2013.01); *H01G 9/2059* (2013.01); *H01G 9/2063* (2013.01); *H10K 85/322* (2023.02); *H10K 85/658* (2023.02)

(56) References Cited

OTHER PUBLICATIONS

Written Opinion of the ISA for PCT/EP2021/086964, mailed Feb. 8, 2022, 5 pages.
Extended European Search Report for EP20306699.8 mailed May 17, 2021, 7 pages.

* cited by examiner

DERIVATIVES OF PYRROLOPYRROLE CYANINES AND USES THEREOF

CROSS-REFERENCE TO RELATED APPLICATIONS

This application is the US national stage of PCT/EP2021/086964, filed Dec. 21, 2021, which claims the priority of EP 20306699.8, filed Dec. 28, 2020, the entire contents of each foregoing application incorporated herein by reference.

BACKGROUND OF THE INVENTION

Field of the Invention

The present invention concerns new derivatives of pyrrolopyrrole cyanines and uses thereof, in particular as near infrared sensitizers for solar cells.

Description of the Related Art

The search for sensitizers with increasingly high performance for dye sensitized solar cells is a very important issue, because these cells have is discriminating characteristics compared to competing technologies: the aesthetic quality of the cells where the color can be changed as desired, the possibility of manufacturing cells on flexible or rigid substrates, semi-transparency of the device, the PV performance not very sensitive to the intensity of the light source, nor its orientation angle and cell temperature, etc. These properties make them promising candidates for PV integrated into the buildings and inside home (J. Mater. Chem. A, 2016, 4, 8512-8540; Nature Energy, vol 2, November 2017, 849-860; and Adv. Mater. 2017, 29, 1700192).

Today, the stake in this field is to exploit the field of low energies (long wavelengths) and in particular of the near infrared (near infrared, "NIR") because few dyes absorb specifically in this spectral range yet rich in energy (about 40% of the total energy received by the earth from the sun), and those tested are generally very inefficient.

To date, there is no known solution which gives complete satisfaction for making colorless, transparent and effective cells. There are sensitizers for DSSCs which exploit the NIR domain a little, but the coloration remains strong because the absorption spectrum of the dye still covers too much the visible wavelengths. All organic cells (OPV) and perovskite cells target this new axis of development, but with lower performances.

In the field of OPV there are some photovoltaic devices made up of a mixture of 2 compounds with a certain transparency, but this mixture remains substantially colored. The degree of coloration of a film can be quantitatively described by the AVT (Average Visible light Transmittance) factor. This is a numeric value in percent, which indicates the transmittance of a material in the entire visible range (400-700 nm) weighted at each wavelength by the photopic response of the human eye and the quantity of photons in the solar spectrum. The best transparent OPV cells offer power conversion efficiencies (PCE) of around 5.1% with an AVT of 51.5% or a PCE of 9.7% with an AVT of 34% (Lee, K.; Um, H.-D.; Choi, D.; Park, J.; Kim, N.; Kim, H.; Seo, K. The Development of Transparent Photovoltaics. Cell Reports Physical Science 2020, 1, 100143).

Perovskite solar cells is another emerging technology that aims at transparent and colorless devices (Nature Energy, vol 2, November 2017, 849-860; Adv. Mater. 2017, 29, 1700192; ACS Appl. Energy Mater. 2019, 2, 3972-3978; Joule 2, 1-11 Sep. 19, 2018; https://doi.org/10.1016/j.joule.2018.06.004). The perovskite in question (lead, iodine, ammonium) is however a very opaque material in is the visible range; the transparency of the device is then obtained thanks to small holes drilled in the cell. The best PCE obtained to date is around 8.2% but with an AVT of 22% (Solar Energy Materials and Solar Cells 196 (2019)) only or 10.7% with an AVT of 37.5% (Adv. Energy Mater. 2015, 5, 1500486). Large gap perovskite cells therefore only exploiting UV and near UV light have an AVT close to 70% but lead to a low efficiency of around 1% (ACS Appl. Energy Mater. 2019, 2, 3972). In addition, it should be noted that the marketing of perovskite cells is severely hampered by the presence of lead and their stability which remains to be improved.

In the field of DSSCs, there are very few active dyes only in the near infrared field. Among those described, we can cite the derivatives of squaraines, of which the best dye (HSQ5) offers a PCE of 3.66% with a maximal transmittance of 60.3% but it nevertheless gives a green coloration to the device and AVT is not evaluated (Adv. Energy Mater. 2014, 4, 1301966). Finally, the LSCs technology (Luminescence Solar Concentrator) is optimal in terms of AVT (88.3%) but very low in terms of PCE around 0.4%.

SUMMARY OF THE INVENTION

The aim of the present invention is to provide compounds being useful as dyes that strongly and selectively absorb in the near infrared range and having a low absorbance in the visible range.

Another aim of the present invention is to provide compounds having photoelectrochemical properties allowing the preparation of efficient dye-sensitized solar cells (DSSC).

The aim of the present invention is also to provide colorless, transparent and efficient cells.

Therefore, the present invention relates to a compound having the following formula (I):

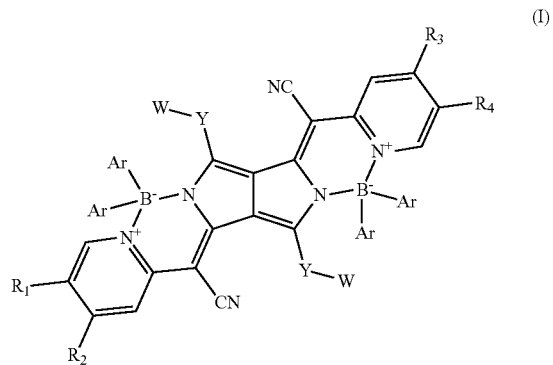

wherein:

Ar is selected from the group consisting of:
- a phenyl group; and
- a phenyl group substituted with at least one substituent L selected from the group consisting of:
  - $(C_1-C_1)$alkyl groups;
  - $(C_1-C_{16})$alkoxy groups; and
  - $(C_1-C_{16})$thioalkyl groups;

Y is selected from the group consisting of:
  a phenylene radical; and
  a thiophenylene radical;
  a furanylene radical; and
W is a phenyl group comprising at least one substituent Z, in particular one, two or three substituents Z,
wherein Z is selected from the group consisting of:
  $(C_1-C_{12})$alkyl groups;
  $(C_1-C_{12})$alkoxy groups; and
  $di((C_1-C_2)$alkyl$)$amino groups;
$R_1$ is H;
$R_2$ is an anchoring group selected from the group consisting of:
  a —COOH group;
  a —C(=O)—NH(OH) group;
  a —CH=C(CN)(COOH) group; and
  a —PO$_3$H$_2$ group;
$R_3$ is selected from the group consisting of:
  H;
  an anchoring group selected from the group consisting of:
    a —COOH group;
    a —C(=O)—NH(OH) group;
    a —CH=C(CN)(COOH) group; and
    a —PO$_3$H$_2$ group;
  $(C_1-C_{16})$alkyl groups;
  $(C_1-C_{16})$alkoxy groups;
  $(C_1-C_{16})$thioalkyl groups; and
  a group having the following formula (III):

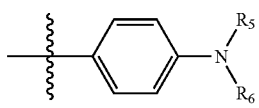
(III)

wherein $R_5$ and $R_6$, identical or different, preferably identical, are selected from the group consisting of:
  $(C_1-C_{16})$alkyl groups;
  a group having the following formula (IV):

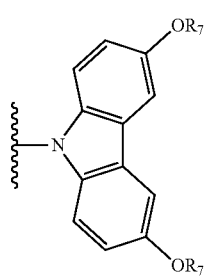
(IV)

$R_7$ being a $(C_1-C_{16})$alkyl group;
  a group having the following formula (V):

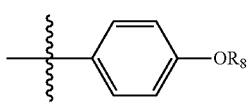
(V)

$R_8$ being a $(C_1-C_{61})$alkyl group;
  a group having the following formula (VI):

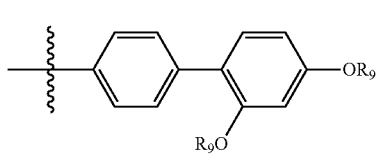
(VI)

$R_9$ being a $(C_1-C_{16})$alkyl group;
  a group having the following formula (III-1):

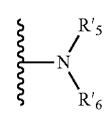
(III-1)

wherein $R'_5$ and $R'_6$, identical or different, preferably identical, are a group having the following formula (VI-1):

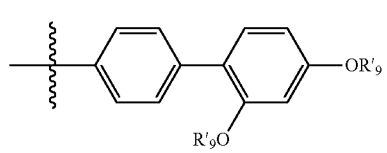
(VI-1)

$R'_9$ being a $(C_1-C_{16})$alkyl group;
$R_4$ is selected from the group consisting of:
  H;
  $(C_1-C_{16})$alkyl groups;
  $(C_1-C_{16})$alkoxy groups;
  $(C_1-C_{16})$thioalkyl groups; and
  a group having the following formula (VII):

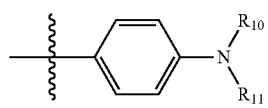
(VII)

wherein $R_{10}$ and $R_{11}$ identical or different, preferably identical, are selected from the group consisting of:
  $(C_1-C_{16})$alkyl groups;
  a group having the following formula (VIII):

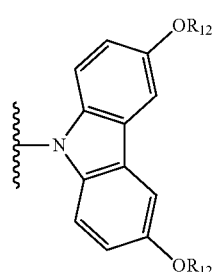
(VIII)

$R_{12}$ being a $(C_1$-$C_1)$alkyl group;

a group having the following formula (IX):

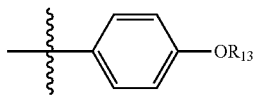
(IX)

$R_{13}$ being a $(C_1$-$C_{16})$alkyl group;

a group having the following formula (X):

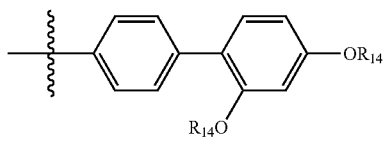
(X)

$R_{14}$ being a $(C_1$-$C_{16})$alkyl group.

The following definitions are set forth to illustrate and define the meaning and scope of the various terms used to describe the invention herein.

The expression "Ct-Cz" means a carbon-based chain which can have from t to z carbon atoms, for example $C_1$-$C_3$ means a carbon-based chain which can have from 1 to 3 carbon atoms.

The term "alkyl group" means: a linear or branched, saturated, hydrocarbon-based aliphatic group comprising, unless otherwise mentioned, from 1 to 16 carbon atoms, and preferably from 1 to 12 carbon atoms. By way of examples, mention may be made of methyl, ethyl, n-propyl, isopropyl, butyl, isobutyl, tert-butyl or pentyl groups.

The term "alkoxy group" means: an —O-alkyl radical where the alkyl group is as previously defined. By way of examples, mention may be made of —O—(C1-C16)alkyl groups, and in particular the —O-methyl group, the —O-ethyl group as —O—C3alkyl group, the —O-propyl group, the —O-isopropyl group, and as —O—C4alkyl group, the —O-butyl, —O-isobutyl or —O-tert-butyl group.

The term "thioalkyl group" means: a —S-alkyl radical where the alkyl group is as previously defined. By way of examples, mention may be made of —S—(C1-C16)alkyl groups, and in particular of —S—(C1-C12)alkyl groups.

The term "phenylene" means a divalent benzene ring (—C6H4-).

The term "thiophenylene" means a divalent thiophene ring.

The term "furanylene" means a divalent furane ring.

The term "dialkylamino" means: an —N(alkyl)2- group, the alkyl group being as defined above.

According to an embodiment, in formula (I), Ar is selected from the group consisting of:
a phenyl group;
a substituted phenyl group comprising one substituent in ortho, meta or para position, having the following formula (1):

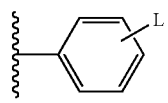
(1)

L being as defined above in formula (1);

a substituted phenyl group having the following formula (2):

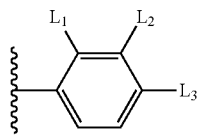
(2)

wherein $L_1$ is selected from the group consisting of:
  $(C_1$-$C_{16})$alkyl groups;
  $(C_1$-$C_{16})$alkoxy groups; and
  $(C_1$-$C_1)$thioalkyl groups;

$L_2$ is H and $L_3$ is selected from the group consisting of:
  $(C_1$-$C_{16})$alkyl groups;
  $(C_1$-$C_{16})$alkoxy groups; and
  $(C_1$-$C_{16})$thioalkyl groups;

or $L_3$ is H and $L_2$ is selected from the group consisting of:
  $(C_1$-$C_{16})$alkyl groups;
  $(C_1$-$C_{16})$alkoxy groups; and
  $(C_1$-$C_{16})$thioalkyl groups;

a substituted phenyl group having the following formula (3):

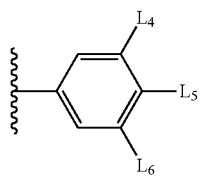
(3)

wherein $L_4$ is selected from the group consisting of:
  $(C_1$-$C_{16})$alkyl groups;
  $(C_1$-$C_{16})$alkoxy groups; and
  $(C_1$-$C_{16})$thioalkyl groups;

$L_5$ is H and $L_6$ is selected from the group consisting of:
  $(C_1$-$C_{16})$alkyl groups;
  $(C_1$-$C_{16})$alkoxy groups; and
  $(C_1$-$C_{16})$thioalkyl groups;

or $L_6$ is H and $L_5$ is selected from the group consisting of:
  $(C_1$-$C_{16})$alkyl groups;
  $(C_1$-$C_{16})$alkoxy groups; and
  $(C_1$-$C_{16})$thioalkyl groups.

According to an embodiment, in formula (I), Ar is selected from the group consisting of:
a phenyl group;
a substituted phenyl group comprising one substituent in ortho, meta or para position, having the formula (1) as defined above;

a substituted phenyl group having the above formula (2) wherein L₂ is H and L₃ is selected from the group consisting of: $(C_1\text{-}C_{16})$alkyl groups; $(C_1\text{-}C_{16})$alkoxy groups; and $(C_1\text{-}C_{16})$thioalkyl groups;

a substituted phenyl group having the above formula (2) wherein L₂ is selected from the group consisting of: $(C_1\text{-}C_1)$alkyl groups; $(C_1\text{-}C_{16})$alkoxy groups; and $(C_1\text{-}C_5)$thioalkyl groups; and L₃ is H;

a substituted phenyl group having the above formula (3) wherein L₅ is H and L₆ is selected from the group consisting of: $(C_1\text{-}C_{16})$alkyl groups; $(C_1\text{-}C_{16})$alkoxy groups; and $(C_1\text{-}C_{16})$thioalkyl groups; and a substituted phenyl group having the above formula (3) wherein L₅ is selected from the group consisting of: $C_1\text{-}C_{16}$)alkyl groups; $(C_1\text{-}C_{16})$alkoxy groups; and $(C_1\text{-}C_{16})$thioalkyl groups; and L₆ is H.

According to an embodiment, in formula (I), Ar is selected from the group consisting of:

a phenyl group;

a substituted phenyl group having the formula (1) as defined above;

a substituted phenyl group having the formula (2) as defined above, wherein:
  L₁ is as defined above; and
  L₂ is H and L₃ is identical to L₁ or L₃ is H and L₂ is identical to L₁; and a substituted phenyl group having the formula (3) as defined above, wherein:
  L₄ is as defined above; and
  L₅ is H and L₆ is identical to L₄ or L₆ is H and L₅ is identical to L₄.

According to an embodiment, in formula (I), Ar is a phenyl group, a p-tert-butylphenyl group or a phenyl group substituted with an alkoxy group.

According to an embodiment, in formula (I), Y is a phenylene radical or a thiophenylene radical.

According to an embodiment, in formula (I), Y is a phenylene radical.

The present invention also relates to a compound as defined above, having the following formula (II):

(II)

wherein Ar, R₁, R₂, R₃, R₄, and W are as defined above.

According to an embodiment, in formula (I) or in formula (II) as defined above, W is a group having one of the below formulae (4) to (7):

(4)

(5)

(6)

(7)

Z being as defined above.

According to an embodiment, in formula (I) or in formula (II), R1 is H and R2 is an anchoring group as defined above in formula (I), such as —COOH.

According to an embodiment, in formula (I) or in formula (II), R1 is H and R2 is —COOH.

According to an embodiment, in formula (I) or in formula (II), R1 and R4 are H, and R2 and R3 are anchoring groups as defined above.

According to an embodiment, in formula (I) or in formula (II), R1 and R4 are H, and R2 and R3 are —COOH.

According to an embodiment, in formula (I) or in formula (II), R1 and R4 are H, and R2 is —COOH and R3 is a group of formula (VII) or (VII').

According to an embodiment, in formula (I) or in formula (II), R1 and R3 are H, and R2 is —COOH and R4 is a group of formula (VII).

According to a preferred embodiment, the present invention relates to a compound having one of the following formulae:

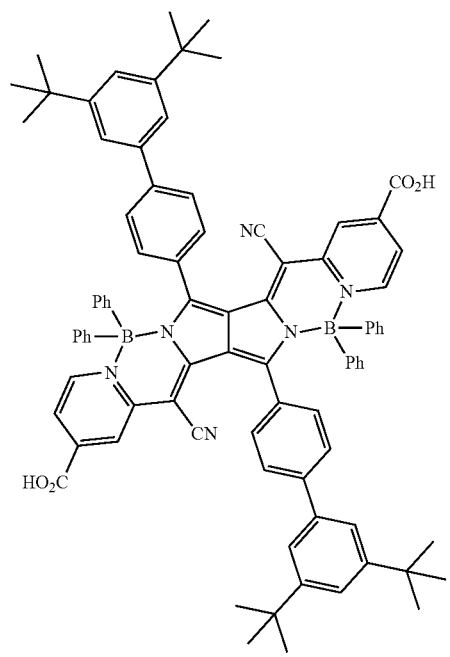
S1
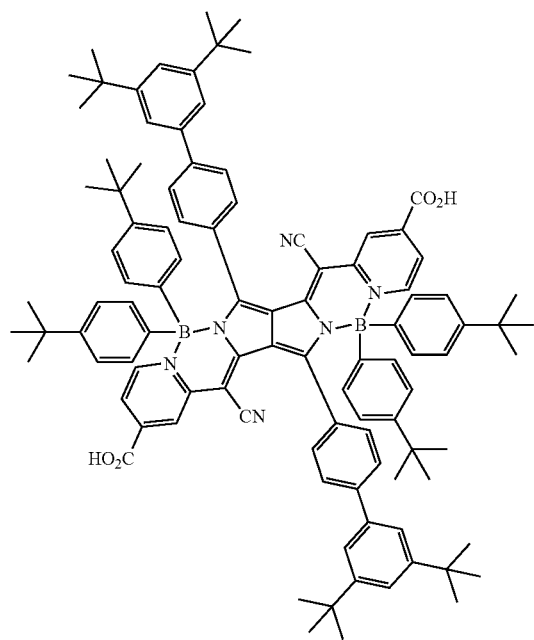
S2

-continued
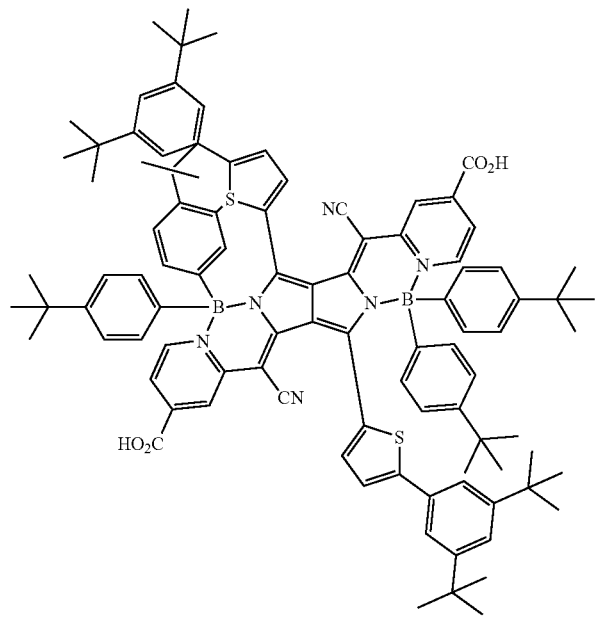
S3
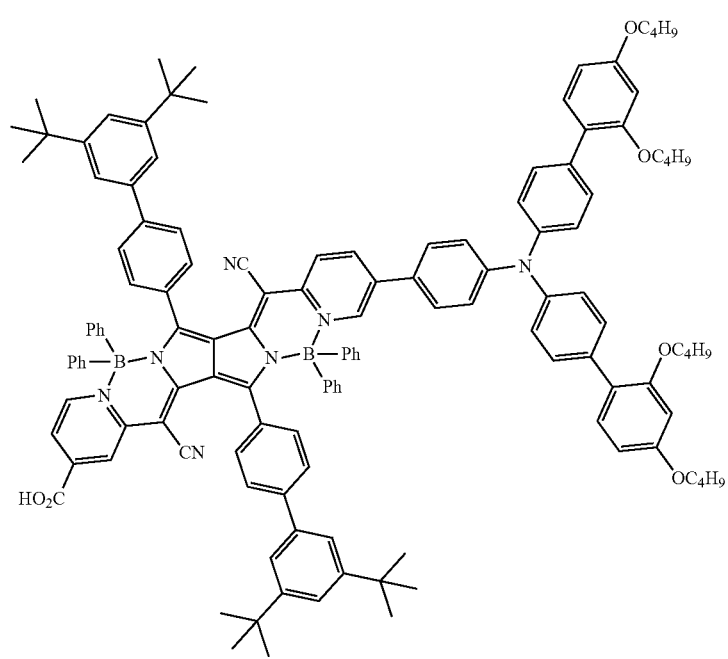
S4

-continued
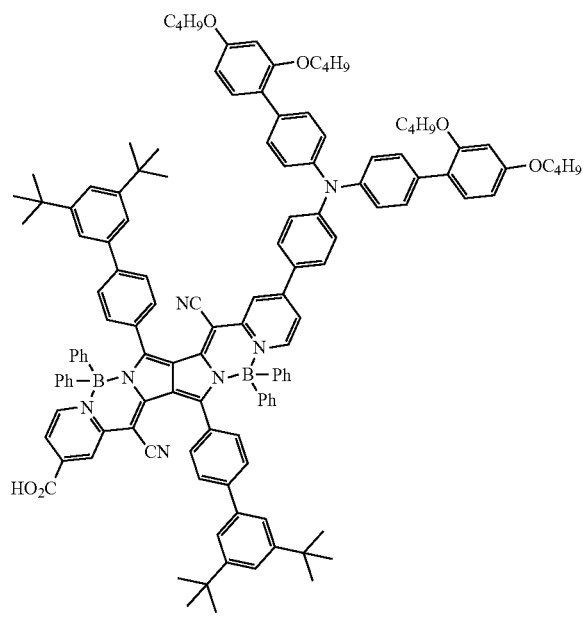
S5
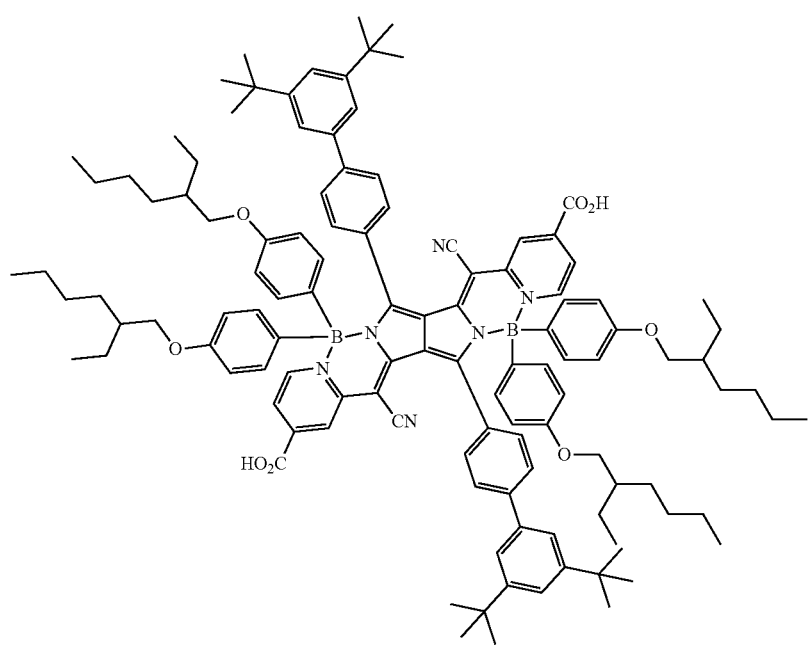
S6

S7

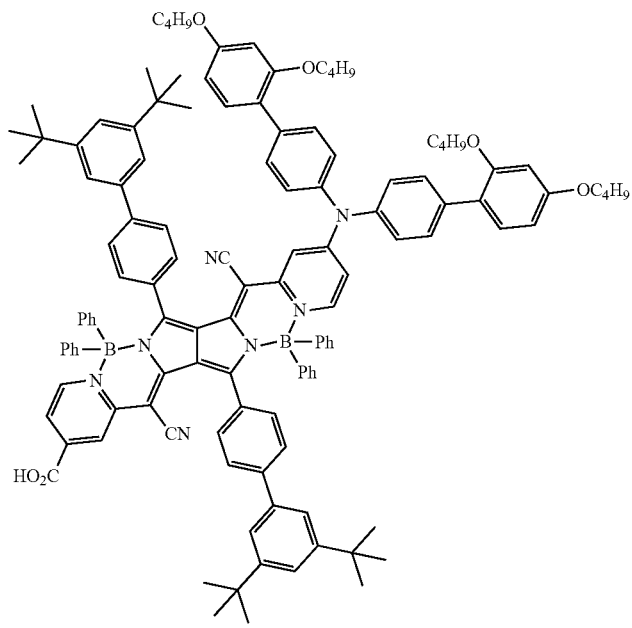

The present invention also relates to the use of a compound of formula (I) as defined above as a dye sensitizer.

The present invention also relates to a dye sensitized solar cell comprising at least one compound of formula (I) as defined above as dye sensitizer.

The compounds of formula (I) as defined above have a low absorption in the visible range and thus can be used to prepare DSSC being transparent and colorless.

The compounds according to the invention have a strong absorbance in the near infrared (NIR) and are also efficient as they have proved already a PCE of at least 4% under standard A.M.1.5G light conditions.

The DSSCs cells prepared with the dyes according to the invention have a PCE of 4% (Jsc=15.6 mA/cm2, Voc=430 mV, ff=0.59) with an AVT which can be superior to 75%, which demonstrates the great potential of this new family of compounds.

The sensitizers according to the invention are able to absorb little or not at all in the visible range, making them almost colorless for the naked eye.

The sensitizer is integrated in the DSSC device by chemisorption to a large bandgap semi-conductor such as TiO2, ZnO, SnO2 or their derivatives including doped materials, constituting the photo-active electrode. This is carried out by soaking the photo-anode in a solution with the dye solubilized containing deaggregating/coadsorbant agent. The nanoparticles of the large bandgap semi-conductor are deposited by screen-printing from a paste containing the nanoparticles followed by post-annealing treatment to remove the porogen. It leads to a porosity that can be modulated between 25 to 70%. The transparent counter-electrode is based on glass transparent conducting oxide bearing low amount of electrocatalytic nanoparticles such as Pt, graphene or related materials, MXenes, sulfides to maintain high optical transparency. The liquid electrolyte is composed of a solvent or solvent-free ionic liquids containing additives such imidazolium or pyridinium-based molecules, alkali cations and the redox mediator such as iodine/iodide, tempo-derivatives, binary systems such as iodo-bromide or iodo-sulfide systems or organometallic complexes. The two electrodes are sealed together using a thermoplastic polymer heated under ambient or controlled atmosphere. Glass-frit sealing of devices is a second option to ensure high quality sealing and barrier to O2 or water ingress. The electrolyte is injected by vacuum back-filling or by means of a peristatic pump flow through UV-drilled or sandblasting hole located at the counter-electrode side. This part is hermetically sealed either by a polymer or a glass-frit after electrolyte injection. An antireflecting coating can be applied to the two sides of the device using a ultra-thin layer of SiO2 nanoparticles deposited by spin coating.

The DSSC according to the invention may be used to prepare a transparent window which can be used for building-integrated, automobile-integrated, building applied PV or urban street equipment. It can be integrated as a transparent embodiment for nomadic electronics or on-screen applications.

According to an embodiment, the dye sensitized solar cell of the invention further comprises at least one further dye, said dye being identical to or different from a compound of formula (I) according to the invention.

As further dyes, the followings may be mentioned: Ru, Fe, Cu, Zn or Os-based coordination complexes, organic donor-π-acceptor molecules, polymethine, croconines or squaraine dyes.

The present invention also relates to the use of a compound of formula (I) as defined above as a dye sensitizer in dye-sensitized photocatalytic systems (DSPs) for hydrogen production, CO2 reduction, water oxidation, organic compounds activation or degradation of pollutants.

A typical DSP is composed of a photosensitizer (PS) and a catalyst (CAT) which are both co-grafted onto n-type semiconductor (n-SC) nanoparticles (NPs), usually titanium dioxide (TiO2)(see Chem. Soc. Rev., 2016, 45, 9 and Eur. J. Inorg. Chem. 2020, 899-917). The operation principle of DSP shares many similarities with DSSC. Upon light irradiation, the PS absorbs photons and injects electrons in the conduction band (CB) of the n-SC, which acts as electron mediator between the PS and the CAT. Then, the reduced CAT performs the desired reaction ($H_2$ production or $CO_2$ reduction). Finally, the oxidized PS ($PS^+$) is regenerated by an external sacrificial electron donor (SD). Many similar sensitizers of DSSC have been successfully implemented in DSP (see Chem. Soc. Rev., 2016, 45, 9 and Eur. J. Inorg. Chem. 2020, 899-917), but very few effectively exploit NIR window to produce fuels (ACS Omega 2019, 4, 14272-14283; ACS Appl. Energy Mater. 2019, 2, 448-458; and J. Phys. Chem. C 2018, 122, 495). Owing to the high efficiency of DPP dyes in DSC, it is reasonable to expect significant efficiency of the latter dyes in DSPs. For example, the described compounds in this patent can be certainly co-immobilized on $TiO_2$ NPs with a molecular or inorganic catalyst for $CO_2$ reduction of $H_2$ production.

EXAMPLES

Example 1: Preparation of Sensitizer S1

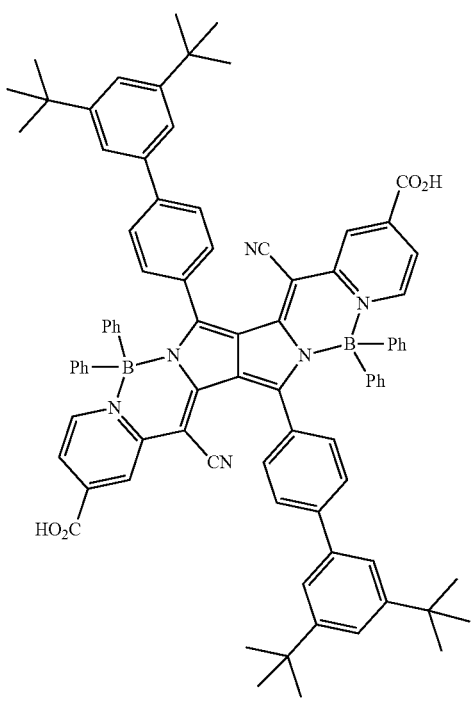

1. Synthesis of Intermediate Compound DPP-1

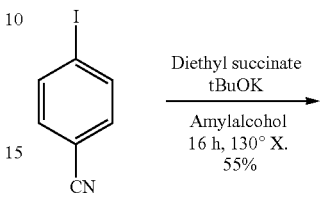

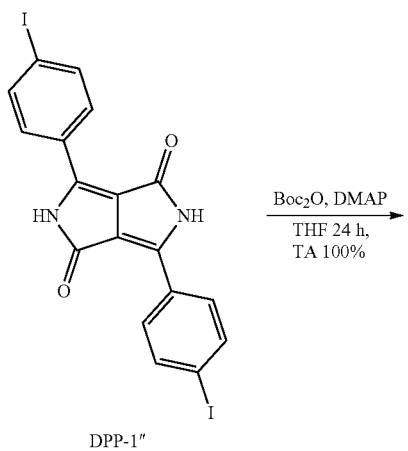

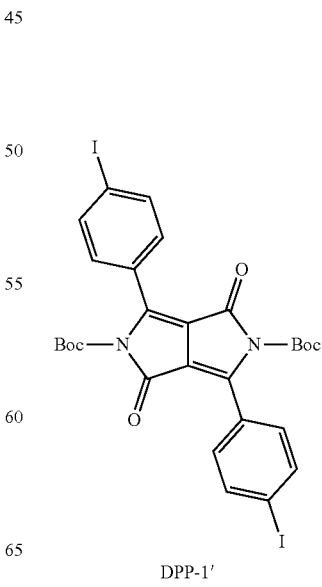

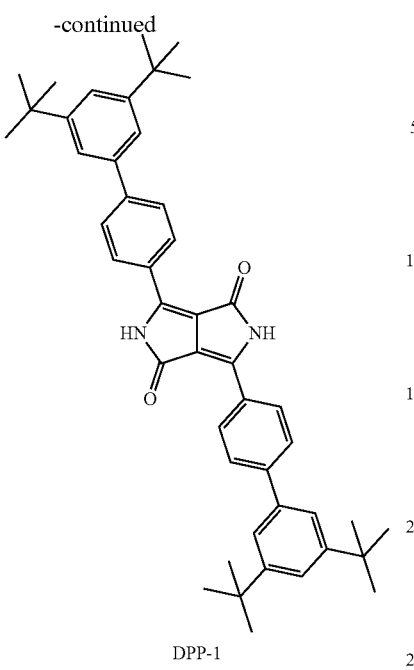

DPP-1

1.1. Preparation of DPP-1″

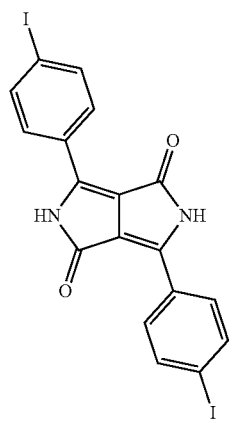 [SMILES: O=C1NC(c2ccc(I)cc2)=C2C(=O)NC(c3ccc(I)cc3)=C12]

Figure 1:
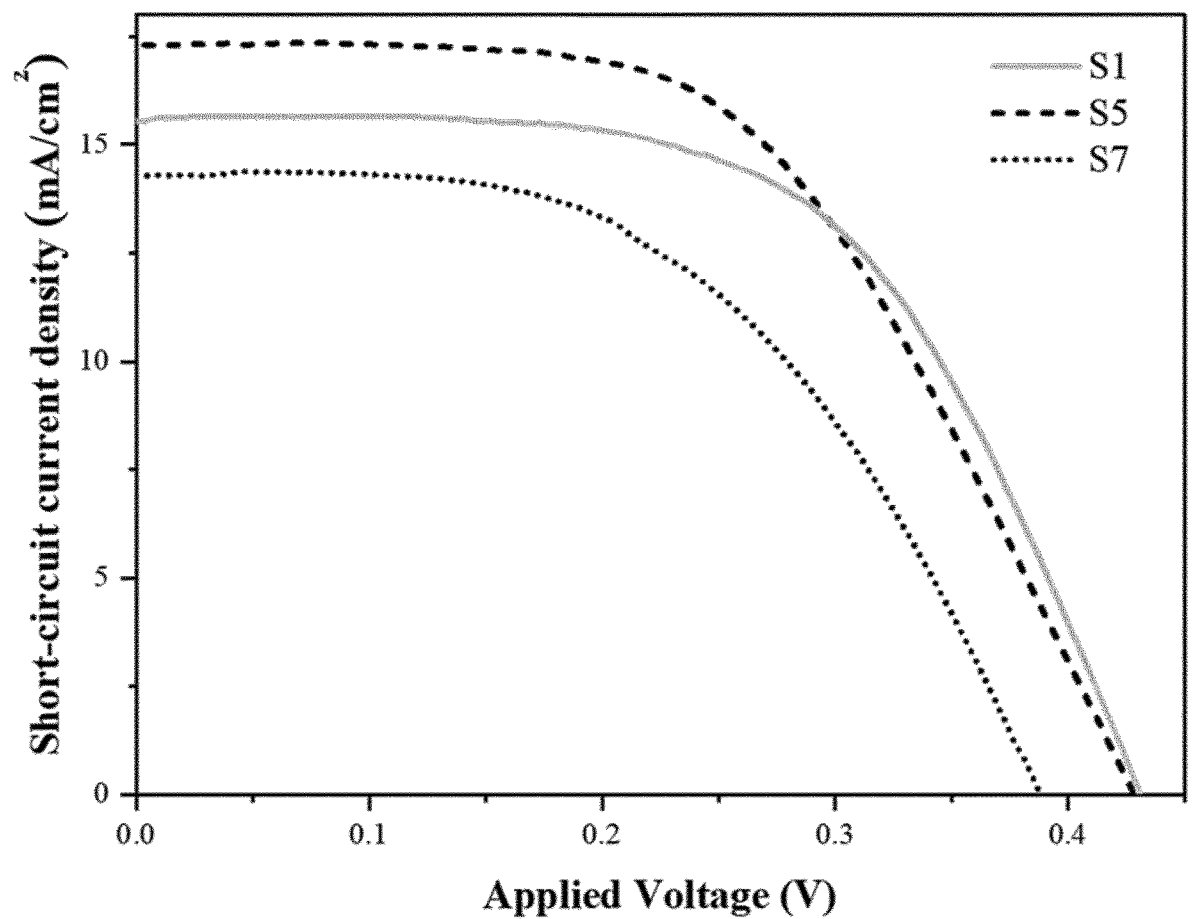
FIG. 1: (J-V) curve measured under A.M.1.5G conditions upon optimized conditions and electrolyte formulation with DSSC including S1, S5 or S7 dyes.
Figure 2:
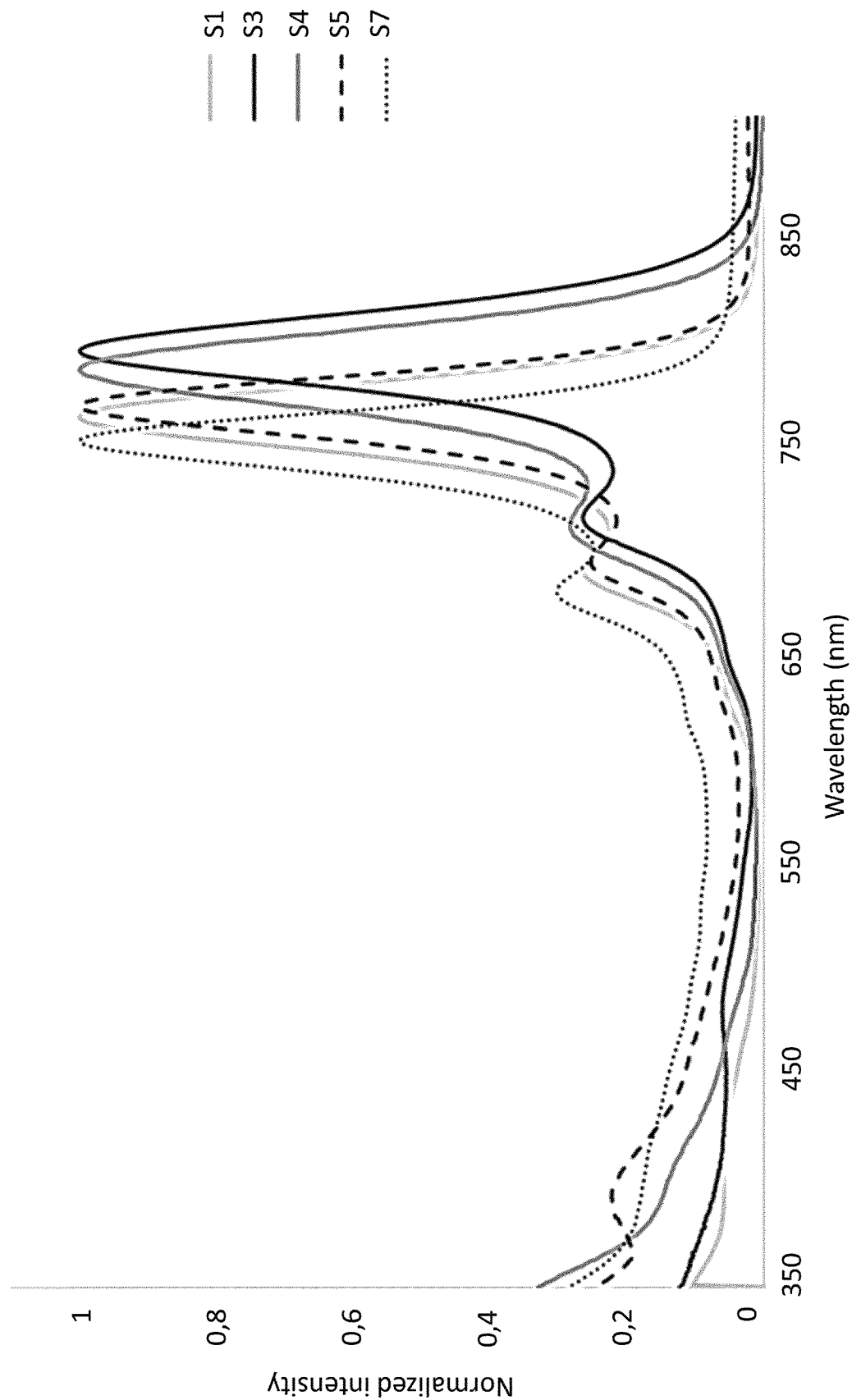
FIG. 2: Absorption spectra of S1, S3, S4, S5 and S7 recorded in DMF solution.
Figure 3:
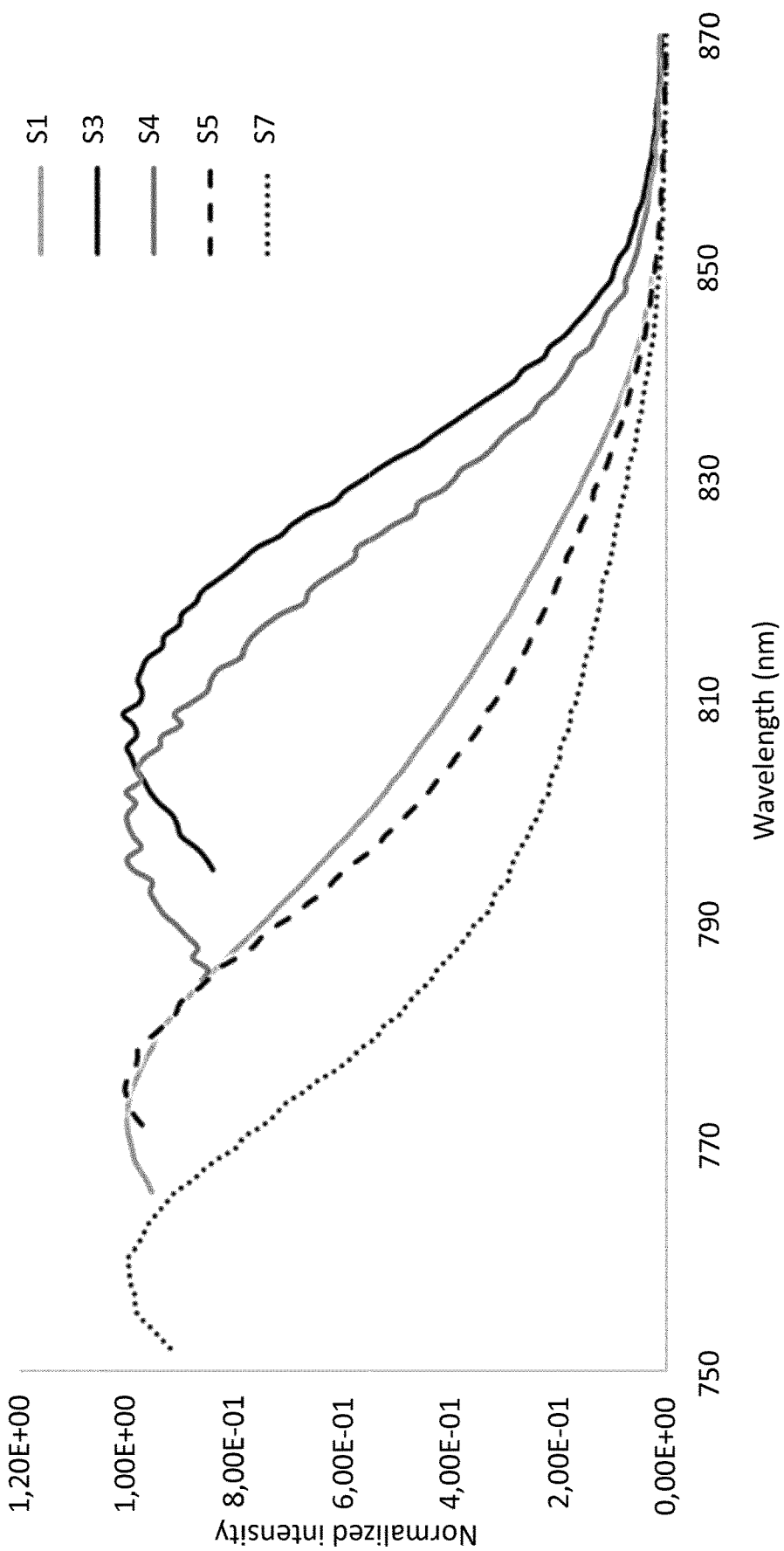
FIG. 3: Emission spectra of S1, S3, S4, S5 and S7 recorded in DMF solution.
Figure 4:
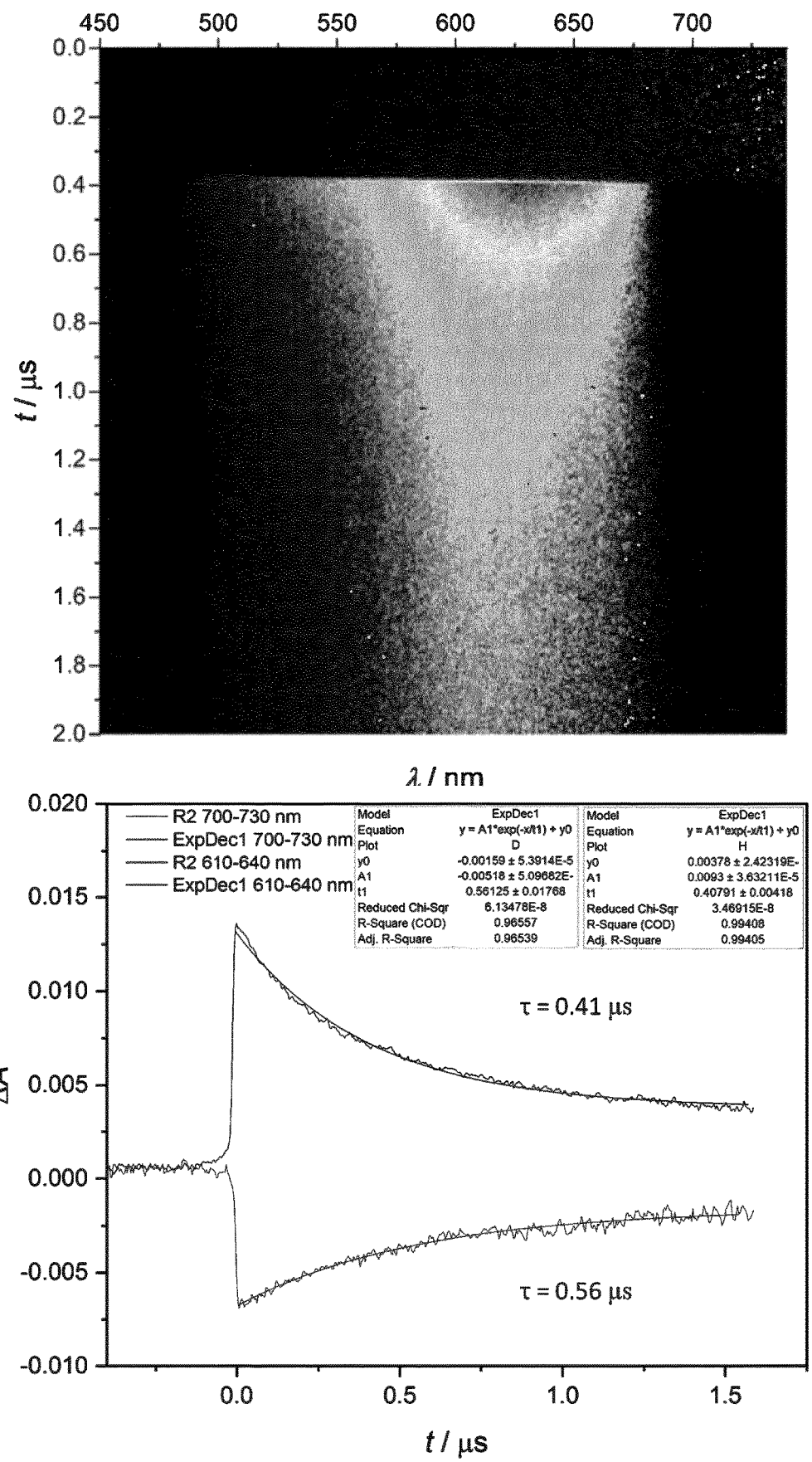
FIG. 4: Streak image and variation of absorbance for the ground-state and radical cation of the dye (S1) in DSSC obtained by ps-pump probe transient absorption spectroscopy.

A catalytic amount of FeCl₃ was dissolved in t-amylalcohol (20 mL), small cubes of solid sodium were added (1 g, 44 mmol, 5 eq) and the mixture was heated at 90° C. for 1 h. A suspension of 4-iodobenzonitrile (5 g, 22 mmol, 2.5 eq) in t-amylacohol (12.5 mL) was added, followed by a dropwise addition of diethyl succinate (1.52 g, 8.7 mmol), the resulting red solution was heated at 90° C. The mixture was cooled at room temperature and acetic acid (5 mL), was added dropwise under vigorous stirring. After complete addition the red slurry was stirred at 110° C. for 30 minutes and then cooled at room temperature, the resulting precipitate was recovered by filtration and washed with water and methanol to afford the desired compound as a dark powder (1.5 g, 37%). Due to its high insolubility in common organic solvents, DPP-1″ was used without further purification.

1.2. Preparation of DPP-1′

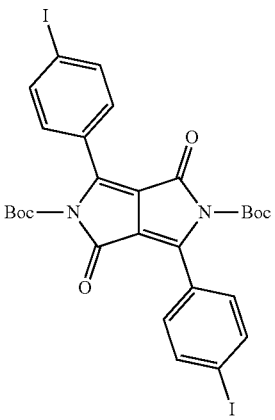 [SMILES: CC(C)(C)OC(=O)N1C(=O)C2=C(c3ccc(I)cc3)N(C(=O)OC(C)(C)C)C(=O)C2=C1c1ccc(I)cc1]

Under argon atmosphere, DPP-1″ (1.5 g, 2.8 mmol) and DMAP (0.17 g, 1.4 mmol, 0.5 eq) were dissolved in dry THF (80 mL) and stirred 30 minutes at room temperature. Di-tert-butyl dicarbonate (1.5 g, 6.9 mmol, 2.5 eq) dissolved in 20 mL of dry THF was added dropwise to the reaction mixture. The reaction was stirred overnight at room temperature. The solution was quenched with water, extracted three times with ethyl acetate and the organic layer was dried over magnesium sulfate.

Solvents were removed under reduce pressure at 25° C. to afford the desired compound as a yellow solid (2.06 g, 100%).

MW (g·mol⁻¹): 740.33

NMR (¹H, CDCl₃, 400 MHz), δ (ppm): 7.83 (d, ³J=8.63 Hz, 4H), 7.46 (d, ³J=8.65 Hz, 4H), 1.45 (s, 18H)

NMR (¹³C, CDCl₃, 100 MHz), δ (ppm): 159.0, 147.9, 145.4, 137.6, 137.5, 129.7, 127.5, 112.6, 98.5, 85.7, 27.5

MS (ASAP−) m/z: 739.99

1.3. Preparation of Boronic Ester 1

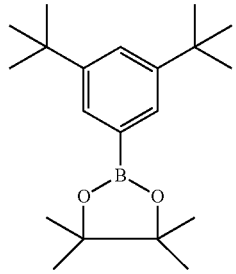 [SMILES: CC(C)(C)c1cc(B2OC(C)(C)C(C)(C)O2)cc(C(C)(C)C)c1]

In a sealable tube, 1-Bromo-3,5-di-tert-butylbenzene 4 (2 g, 7.4 mmol, bis(pinacolato)diboron (2.07 g, 8.2 mmol, 1.1 eq), potassium acetate (2.19 g, 22.3 mmol, 3 eq) and Pd(dppf)Cl₂ (0.27 g, 0.37 mmol, 0.05 eq) were placed under argon atmosphere and dissolved in dry DMF (40 mL). The reaction mixture was heated overnight at 80° C. The reaction was cooled to room temperature, quenched with water, extracted three times with ethyl acetate, dried over magnesium sulfate and solvents were removed under reduce pressure. The crude was purified by column chromatography using CH₂Cl₂/petroleum ether (2/8) as eluent to afford the final product as white crystals (2.12 g, 90%).

MW (g·mol⁻¹): 316.29

NMR (¹H, CDCl₃, 400 MHz), δ (ppm): 7.66 (d, ⁴J=2.03 Hz, 2H), 7.54 (t, ⁴J=2.07 Hz, 1H), 1.35 (s, 18H), 1.34 (s, 12H)

1.4. Preparation of DPP-1

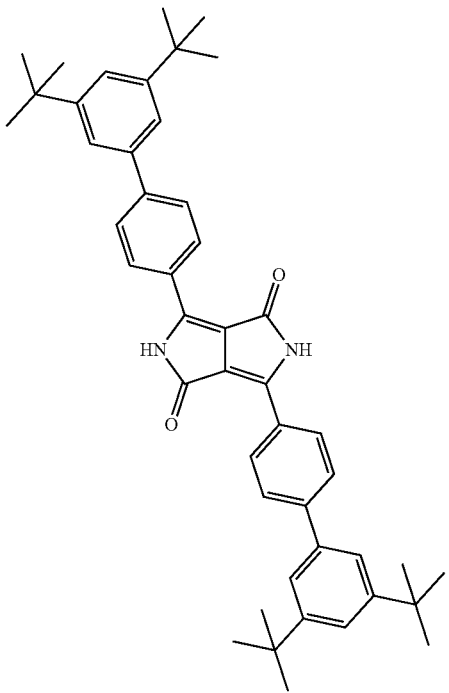 [SMILES: CC(C)(C)c1cc(-c2ccc(C3=C4C(=O)NC(c5ccc(-c6cc(C(C)(C)C)cc(C(C)(C)C)c6)cc5)=C4C(=O)N3)cc2)cc(C(C)(C)C)c1]

In a sealable tube, DPP-1' (0.3 g, 0.41 mmol), boronic ester 1 (0.384 g, 1.22 mmol, 3 eq), and K$_2$CO$_3$ (0.28 g, 2.03 mmol, 5 eq) were placed under argon atmosphere and dissolved in THF (20 mL) and water (6 mL). The solution was degassed 30 minutes under argon in an ultrasonic bath and Pd(PPh$_3$)$_4$ (0.094 g, 0.081 mmol, 0.2 eq) was added. The reaction mixture was heated overnight at 85° C. The reaction was cooled to room temperature, quenched with water, extracted 3 times with ethyl acetate, dried over magnesium sulfate and solvents are removed under reduce pressure. The crude was then heated 30 minutes at 180° C. in the oven. After cooling to room temperature, the resulting solid was dissolved in THF and filtrate through celite. After solvents removal, the product was taken up in cyclohexane and filtrated through membrane to afford the desired compound as a red solid (0.193 g, 71%).

MW (g·mol$^{-1}$): 664.93.

NMR ($^1$H, THF, 400 MHz) δ (ppm): 10.36 (s, 2H), 8.74 (d, $^3$J=8.61 Hz, 4H), 8.00 (d, $^3$J=8.74 Hz, 4H), 7.74 (d, $^4$J=1.75 Hz, 4H), 7.68 (t, $^4$J=1.75 Hz, 2H), 1.58 (s, 36H).

NMR ($^{13}$C, THF, 100 MHz) δ (ppm): 162.2, 151.1, 144.9, 143.1, 139.5, 128.0, 127.3, 127.0, 121.8, 121.3, 111.5, 34.6, 30.8609.

HRMS (ES−) m/z: [M−H]− calculated for C$_{46}$H$_{51}$N$_2$O$_2$: 663.3951. found: 663.3957. Δ=0.9 ppm.

2. Preparation of Intermediate Compound p1

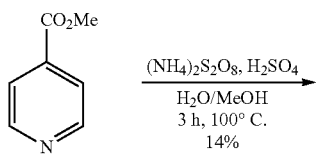

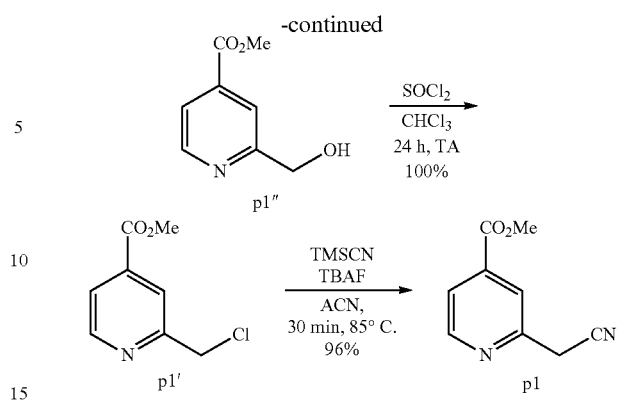

2.1. Preparation of Compound p1″

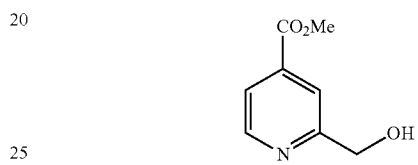

Methyl isonicotinate (25 g, 182 mmol) was dissolved in MeOH (250 mL) and H$_2$SO$_4$ (1 mL) under argon atmosphere and heated at reflux. A solution of ammonium persulfate (75 g, 328 mmol, 1.8 eq) in water (150 mL) was added dropwise and the reaction mixture was stirred overnight at reflux. After cooling to room temperature, the mixture was filtrated through filter paper and the filtrate was concentrated in vacuo to remove MeOH. The resulting solution was extracted 3 times with ethyl acetate, washed 3 times with water, the organic layer was dried over magnesium sulfate and solvents were removed under reduced pressure. The solid was purified by column chromatography using PE/AcOEt (4:6) as eluent to afford the desired compound as yellowish oil (4.16 g, 14%).

MW (g·mol$^{-1}$): 167.17

NMR ($^1$H, CDCl3, 400 MHz) δ (ppm): 8.66 (dd, $^3$J=5.02 Hz, $^4$J=0.83 Hz, 1h), 7.84 (q, $^4$J=2.31 Hz, $^4$J=0.74 Hz, 1H), 7.72 (dt, $^3$J=5.16 Hz, $^4$J=0.76 Hz, 1h), 4.81 (s, 2H), 3.93 (s, 3H)

HRMS (ES+) m/z: [M−H]− calculated for C$_8$H$_{10}$NO$_3$: 168.0661. found: 168.0655. Δ=−3.6 ppm.

2.2. Preparation of Compound p1'

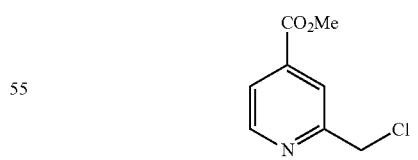

In a solution of SOCl$_2$ (50 mL) at 0° C. was added dropwise p1″ (4.16 g, 24.9 mmol) dissolved in CHCl$_3$ (5 mL). The reaction was stirred overnight at room temperature. CH$_2$Cl$_2$ (100 mL) was added and the solvent were removed under reduce pressure. This step was repeated until the excess of SOCl$_2$ was entirely removed. The resulting grey solid (4.6 g, 100%) was used in the next step without further purification.

MW (g·mol$^{-1}$): 185.61

NMR ($^1$H, CDCl3, 300 MHz) δ (ppm): 8.88 (d, $^3$J=5.52 Hz, 1H), 8.38 (s, 1H), 8.18 (dd, $^3$J=4.20 Hz, $^4$J=1.44 Hz, 1 h), 5.08 (s, 2H), 4.04 (s, 3H)

2.3. Preparation of Compound p1

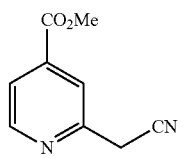 [SMILES: COC(=O)c1ccnc(CC#N)c1]

Under argon atmosphere, p1' (2.5 g, 13.5 mmol) was dissolved in dry ACN (250 mL) and stirred at room temperature. TMSCN (2.53 mL, 20.2 mmol, 1.5 eq) and TBAF (20.2 mL, 20.2 mmol, 1.5 eq) were added and the reaction mixture heated 30 minutes at reflux. Solvents were evaporated. The resulting solid was solubilized in AcOEt and washed 4 times with brine The organic layer was dried over magnesium sulfate and solvents were evaporated. A brown oil (2.29 g, 96%) was obtained without further purification.

MW (g·mol$^{-1}$): 176.18

NMR ($^1$H, CDCl3, 400 MHz) δ (ppm): 8.73 (dd, $^3$J=5.03 Hz, $^4$J=0.77 Hz, 1H), 7.96 (d, $^4$J=0.55 Hz, 1H), 7.82 (dd, $^3$J=4.23 Hz, $^4$J=1.46 Hz, 1H), 4.01 (s, 2H), 3.97 (s, 3H)

NMR ($^{13}$C, CDCl3, 100 MHz) δ (ppm): 164.9, 151.6, 150.8, 138.8, 122.4, 121.5, 116.4, 53.4, 52.9, 26.6, 24.1, 19.7, 13.6823

HRMS (ASAP-) m/z: [M-H]- calculated for C$_9$H7N$_2$O$_2$: 175.0508. found: 175.0510. Δ=1.1 ppm 3. Synthesis of Intermediate Compound PPcy

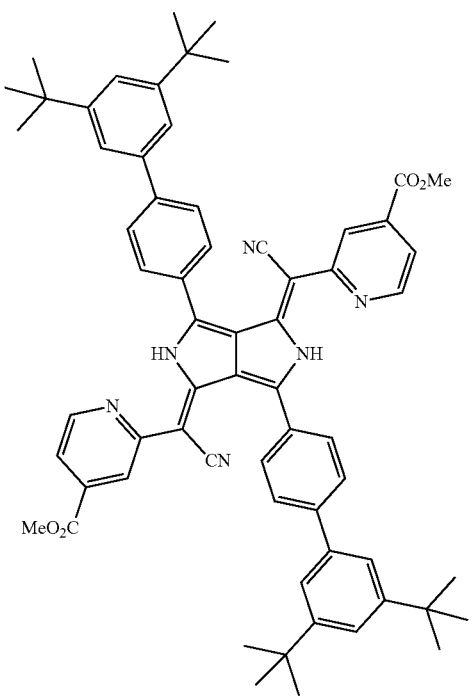 [SMILES: COC(=O)c1ccnc(/C(C#N)=c2\[nH]c(-c3ccc(-c4cc(C(C)(C)C)cc(C(C)(C)C)c4)cc3)c3/c(=C(\C#N)c4cc(C(=O)OC)ccn4)[nH]c(-c4ccc(-c5cc(C(C)(C)C)cc(C(C)(C)C)c5)cc4)c23)c1]

DPP-1 (0.130 g, 0.196 mmol) and p1 (0.088 g, 0.049 mmol, 2.5 eq) were heated to reflux in absolute toluene under argon. Phosphoryl chloride (0.15 mL, 1.57 mmol, 8 eq) was then added. The reaction was monitored by thin-layer chromatography. As soon as DPP-1 was used up or the concentration of by-products increased, the reaction was quenched with water and extracted 3 times with ethyl acetate. The organic layer was dried over magnesium sulfate and solvents were evaporated. The crude product was treated with methanol in an ultrasonic bath. The is solid was collected by filtration and washed with methanol until the filtrate was colorless to afford the desired compound as a green solid (0.13 g, 68%).

MW (g·mol$^{-1}$): 980.50.

NMR ($^1$H, CDCl3, 300 MHz) δ (ppm): 13.54 (s, 2H), 8.61 (d, $^3$J=5.22 Hz, 2H), 7.83 (s, 2H), 7.75 (d, $^4$J=1.60 Hz, 8H), 7.50 (d, $^4$J=1.91 Hz, 4H), 7.48 (d, $^4$J=1.46 Hz, 2H), 7.46 (t, $^4$J=1.81 Hz, 2H), 3.93 (s, 6H), 1.38 (s, 36H).

NMR ($^{13}$C, CDCl3, 100 MHz) δ (ppm): 165.1, 156.2, 151.2, 148.3, 144.9, 143.5, 139.6, 130.5, 127.9, 126.6, 122.1, 121.7, 120.1, 117.6, 116.9, 52.6, 31.5.

MS (ASAP-) m/z: [M]- calculated for C$_{64}$H$_{64}$N$_6$O$_4$S$_2$: 980.4989. found: 980.5007. Δ=1.8 ppm.

3. Synthesis of Intermediate Compound PPcv-2

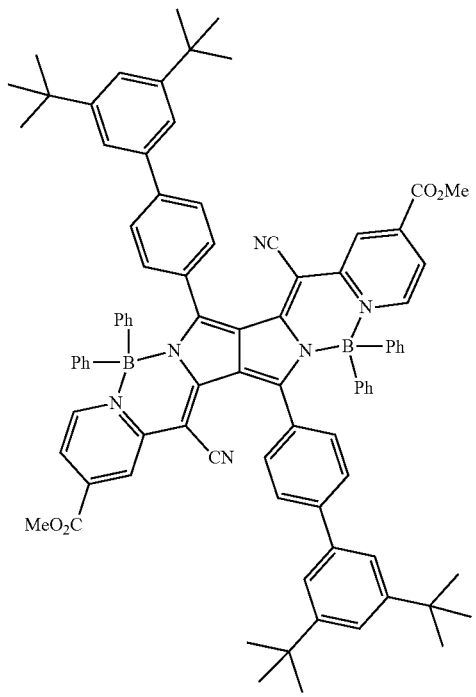

Under argon atmosphere, PPcy (0.10 g, 0.102 mmol,) and N,N-diisopropylethylamine (0.20 mL, 1.02 mmol, 10 eq) were heated to reflux in dry dichloromethane. Chloro(diphenyl)borane (0.2 mL) was added dropwise and the mixture was heated to reflux for 10 min. The reaction mixture was quenched with water, extracted three times with dichloromethane and dried over MgSO$_4$. After removing the solvent, the crude product was purified by column chromatography using DCM/EP (7:3) as eluent to afford the desired compound as a green solid (0.055 g, 41%).

MW (g·mol$^{-1}$): 1309.28

NMR ($^1$H, CDCl3, 300 MHz) δ (ppm): 7.89 (d, $^3$J=6.61 Hz, 2H), 7.86 (d, $^4$J=1.65 Hz, 2H), 7.35 (t, $^4$J=1.42 Hz, 2H), 7.32 (d, $^4$J=1.70 Hz, 4H), 7.16 (d, $^4$J=1.73 Hz, 2H), 7.13 (s, 20H), 7.05 (d, $^3$J=8.24 Hz, 4H), 6.81 (d, $^3$J=8.2 Hz, 4H), 3.81 (s, 6H), 1.39 (s, 36H).

HRMS (ASAP-) m/z: [M]- calculated for C$_{88}$H$_{82}$10B$_2$N$_6$O$_4$: 1306.6656. found: 1306.6689. Δ=2.5 ppm.

4. Synthesis of S1

PPcy-2 (0.055, 0.042 mmol) was stirred at room temperature in THF (10 mL). A solution of LiOH (0.020 g, 0.84 mmol, 20 eq) in water (2 mL) was added dropwise in the reaction mixture and stirred 1 h. Aqueous hydrochloric acid preparation (2M) is added slowly until pH=4. The remaining solution was extracted 3 times with ethyl acetate. After evaporation, the crude product was dissolved in DCM and EP was added. The resulting precipitate was collected by filtration and washed with EP to afford the desired compound as a dark green solid (0.044 g, 81%).

MW (g·mol$^{-1}$): 1281.23

NMR ($^1$H, CDCl3, 300 MHz) δ (ppm): 7.92 (d, $^3$J=6.62 Hz, 2H), 7.90 (d, $^4$J=1.68 Hz, 2H), 7.39 (t, $^4$J=1.81 Hz, 2H), 7.33 (d, $^4$J=1.75 Hz, 4H), 7.13 (m, 22H), 7.05 (d, $^3$J=8.20 Hz, 4H), 6.81 (d, $^3$J=8.23 Hz, 4H), 1.38 (s, 36H).

HRMS (ASAP-) m/z: [M]- calculated for $C_{86}H_{78}{}^{10}B_2N_6O_4$: 1278.6343. found: 1278.6353. Δ=0.8 ppm.

Example 2: Preparation of Sensitizer S2

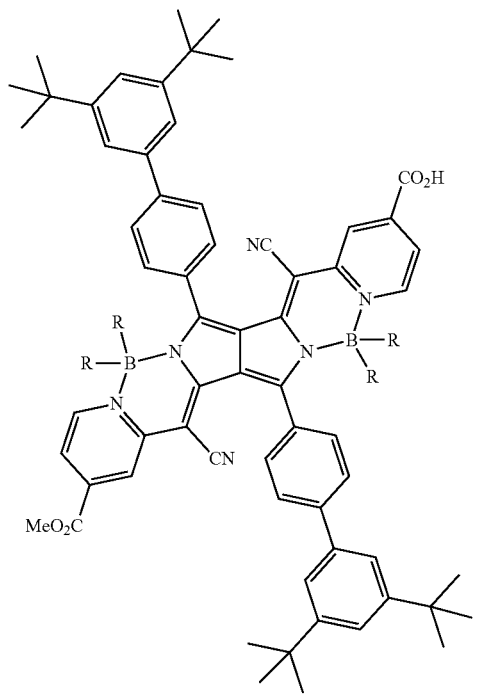

R = 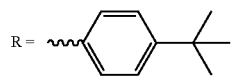

1. Preparation of Intermediate Compound PPcy-3

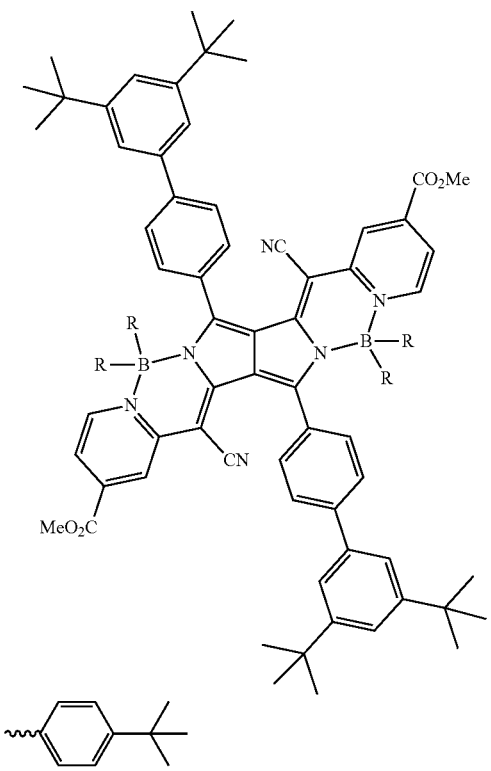

Under argon atmosphere, PPcy (0.030 g, 0.031 mmol,) and N,N-diisopropylethylamine (0.05 mL, 0.306 mmol, 10 eq) were heated to reflux in dry dichloromethane. Bis(4-(tert-butyl)phenyl)chloroborane (0.1 mL) was added dropwise and the mixture was heated to reflux for 10 min. The reaction mixture was quenched with water, extracted three times with dichloromethane and dried over MgSO$_4$. After removing the solvent, the crude product was purified by column chromatography using DCM/EP (7:3) as eluent to afford the desired compound as a green solid (0.022 g, 47%).

MW (g·mol$^{-1}$): 1532.91

NMR ($^1$H, CDCl3, 300 MHz) δ (ppm): 7.96 (d, $^3$J=6.62 Hz, 2H), 7.86 (d, $^4$J=1.20 Hz, 2H), 7.40 (m, 6H), 7.18 (dd, $^3$J=6.36 Hz, $^4$J=1.77 Hz, 2H), 7.14 (d, $^3$J=8.01 Hz, 12H), 7.07 (d, $^3$J=8.28 Hz, 8H), 6.81 (d, $^3$J=8.37 Hz, 4H), 3.79 (s, 6H), 1.37 (s, 36H), 1.25 (s, 36H)

HRMS (ASAP+) m/z: [M–H]+ calculated for $C_{104}H_{115}{}^{10}B_2N_6O_4$: 1331.9239. found: 1531.9181. Δ=−3.8 ppm.

2. Preparation of S2

PPcy-3 (0.020, 0.013 mmol) was stirred at room temperature in THF (5 mL). A solution of LiOH (0.006 g, 0.260 mmol, 20 eq) in water (1 mL) is added dropwise in the reaction mixture and stirred for 1 h. Aqueous hydrochloric acid preparation (2M) is added slowly until pH=4. The remaining solution was extracted 3 times with ethyl acetate. After evaporation, the crude product was dissolved in DCM and EP was added. The resulting precipitate was collected by filtration and washed with EP to afford the desired compound as a dark green solid (0.015 g, 79%).

MW (g·mol$^{-1}$): 1505.66

NMR ($^1$H, CDCl3, 300 MHz) δ (ppm): 7.88 (s, 2H), 7.30 (s, 6H), 7.06 (d, $^3$J=18 Hz, 20H), 6.73 (d, $^3$J=7.40 Hz, 4H), 1.29 (s, 36H), 1.26 (s, 36H)

HRMS (ASAP-) m/z: [M]- calculated for $C_{102}H_{110}N_6O_4{}^{10}B_2$: 1502.8847. found: 1502.8879. Δ=2.1 ppm.

Example 3: Preparation of Sensitizer S3

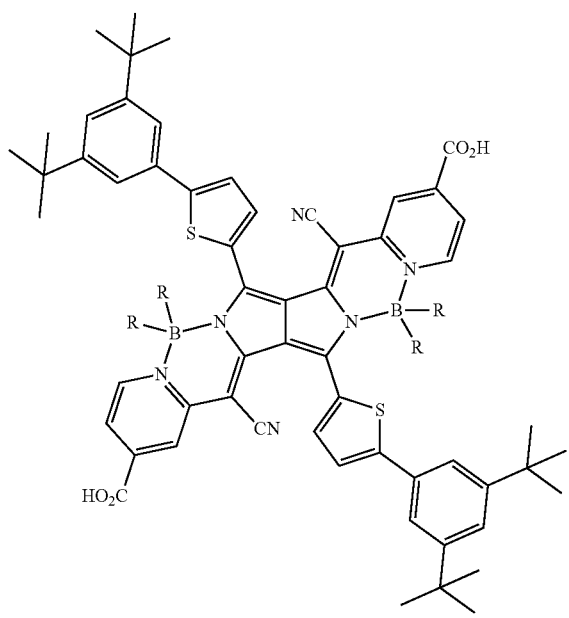

1. Synthesis of Intermediate Compound DPP-2

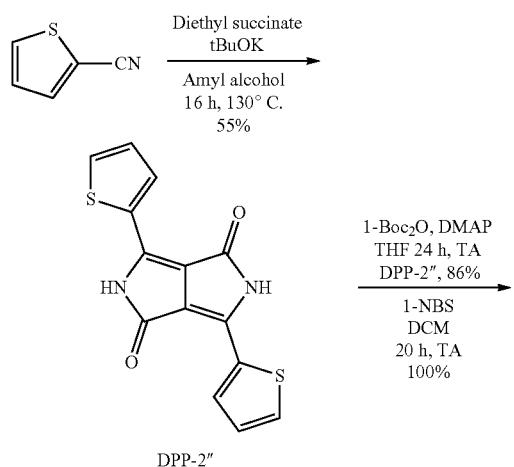

1.1. Preparation of DPP-2'''

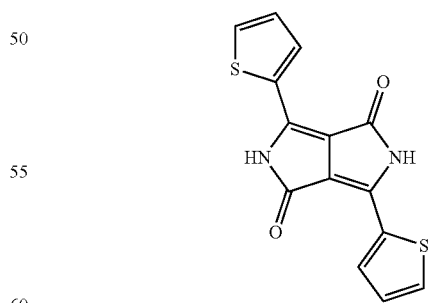

tBuOK (7.2 g, 64 mmol, 3.5 eq) was dissolved in 40 mL of t-amyl alcohol. After complete dissolution of the base at 105° C., thiophene-2-carbonitrile (5 g, 45.8 mmol, 3 eq) was then added to the reaction mixture and the solution was heated one hour at 105° C. A solution of diethylsuccinate (3.19 g, 18.3 mmol) in 20 mL of t-amyl alcohol was added dropwise at reflux within one hour and left overnight. The mixture was cooled at room temperature and acetic acid (5 mL), was added dropwise under vigorous stirring. After complete addition the slurry was stirred at 110° C. for 30 minutes and then cooled at room temperature, the resulting precipitate was recovered by filtration and washed with water and methanol to afford the desired compound as a dark powder (3.2 g, 57%). Due to its high insolubility in common organic solvents, DPP-2''' was used without further purification.

1.2. Preparation of DPP-2''

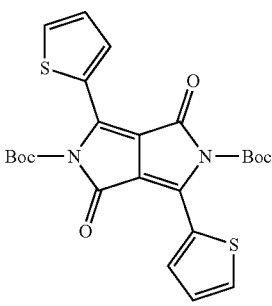 [SMILES: CC(C)(C)OC(=O)N1C(=O)C2=C(c3cccs3)N(C(=O)OC(C)(C)C)C(=O)C2=C1c1cccs1]

Under argon atmosphere, DPP-2''' (1.5 g, 4.99 mmol) and DMAP (0.31 g, 2.5 mmol, 0.5 eq) were dissolved in dry THF (80 mL) and stirred 30 minutes at room temperature. Di-tert-butyl dicarbonate (2.72 g, 12.5 mmol, 2.5 eq) dissolved in 20 mL of dry THF was added dropwise to the reaction mixture. The reaction was stirred overnight at room temperature. The solution was quenched with water, extracted three times with ethyl acetate and the organic layer was dried over magnesium sulfate. Solvents were removed under reduce pressure at 25° C. to afford the desired compound as a dark brown solid (2.15 g, 86%).

MW (g·mol$^{-1}$): 500.58

NMR ($^1$H, CDCl$_3$, 400 MHz), δ (ppm): 8.82 (dd, $^3$J=3.82 Hz, $^4$J=1.14 Hz, 2H), 7.63 (dd, $^3$J=3.80 Hz, $^4$J=1.15 Hz, 2H), 7.18 (dd, $^3$J=4.90 Hz, $^4$J=3.96 Hz, 2H), 1.59 (s, 18H)

NMR (H, CDCl$_3$, 100 MHz), δ (ppm): 159.0, 148.7, 137.9, 133.8, 131.7, 129.6, 128.0, 110.2, 85.8, 27.6

HRMS (ASAP−) m/z: [M]$^-$ calculated for C$_{24}$H$_{24}$N$_2$O$_6$S$_2$: 500.1076. found: 500.1079. Δ=0.6 ppm.

1.3. Preparation of DPP-2'

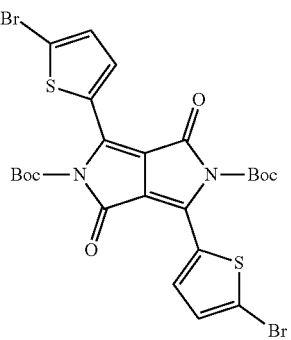 [SMILES: CC(C)(C)OC(=O)N1C(=O)C2=C(c3ccc(Br)s3)N(C(=O)OC(C)(C)C)C(=O)C2=C1c1ccc(Br)s1]

Under argon atmosphere, DPP-2'' (0.2 g, 0.40 mmol) was dissolved in dry DCM (40 mL) and stirred 30 minutes at room temperature. A solution of N-Bromosuccinimide (0.17 g, 1.40 mmol, 3.5 eq) in 10 mL of DCM was added dropwise and the reaction mixture was stirred 16 h at room temperature. The solution was quenched with water, extracted three times with ethyl acetate and the organic layer was dried over magnesium sulfate. Solvents were removed under reduce pressure at 25° C. to afford the desired compound as a dark solid (0.26 g, 100%).

MW (g·mol$^{-1}$): 658.38

NMR ($^1$H, CDCl$_3$, 400 MHz), δ (ppm): 8.08 (d, $^3$J=4.22 Hz, 2H), 7.16 (d, $^3$J=4.26 Hz, 2H), 7), 1.53 (s, 18H)

NMR (H, CDCl$_3$, 400 MHz), δ (ppm): 158.6, 148.8, 136.7, 134.4, 131.0, 130.9, 120.8, 110.3, 86.3, 27.7

HRMS (ASAP−) m/z: [M] calculated for C$_{24}$H$_{22}$N$_2$O$_6$S$_2$: 655.9286. found: 655.9280. Δ=−0.9 ppm.

1.4. Preparation of DPP-2

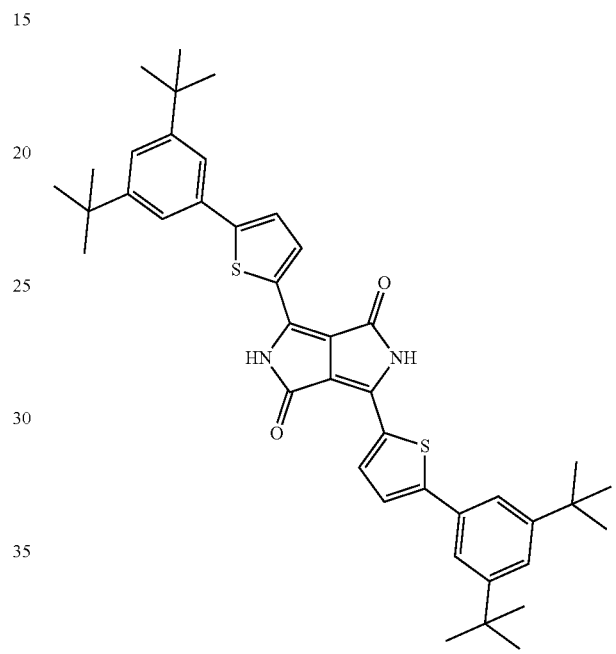

In a sealable tube, DPP-2' (0.3 g, 0.41 mmol), boronic ester 1 (0.384 g, 1.22 mmol, 3 eq), and K$_2$CO$_3$ (0.28 g, 2.03 mmol, 5 eq) were placed under argon atmosphere and dissolved in THF (20 mL) and water (6 mL). The solution was degassed 30 minutes under argon in an ultrasonic bath and Pd(PPh$_3$)$_4$ (0.094 g, 0.081 mmol, 0.2 eq) was added. The reaction mixture was heated overnight at 85° C. The reaction was cooled to room temperature, quenched with water, extracted 3 times with ethyl acetate, dried over magnesium sulfate and solvents are removed under reduce pressure. The crude was then heated 30 minutes at 180° C. in the oven. After cooling to room temperature, the resulting solid was dissolved in THF and filtrated through celite. After solvents removal, the product was taken up in cyclohexane and filtrated through membrane to afford the desired compound as a red solid (0.19 g, 71%).

MW (g·mol$^{-1}$): 676.98

NMR ($^1$H, THF, 400 MHz) δ (ppm): 10.16 (s, 2H), 8.58 (d, $^3$J=4.04 Hz, 2H), 7.62 (d, $^4$J=1.74 Hz, 4H), 7.69 (d, $^3$J=4.03 Hz, 2H), 7.72 (t, $^4$J=1.72 Hz, 2H), 1.52 (s, 36H).

NMR ($^{13}$C, CDCl$_3$, 100 MHz) δ (ppm): 159.5, 149.6, 148.3, 133.9, 133.0, 132.7, 131.1, 131.0, 130.0, 129.9, 129.4, 128.1, 126.5, 126.3, 126.2, 125.8, 122.7, 120.9, 118.4, 107.9, 32.7, 28.8.

HRMS (ASAP+) m/z: [M+H]+ calculated for C$_{42}$H$_{49}$N$_2$O$_2$S$_2$: 677.3235. found: 677.3254. Δ=2.8 ppm.

2. Preparation of Intermediate Compound PPcy-th

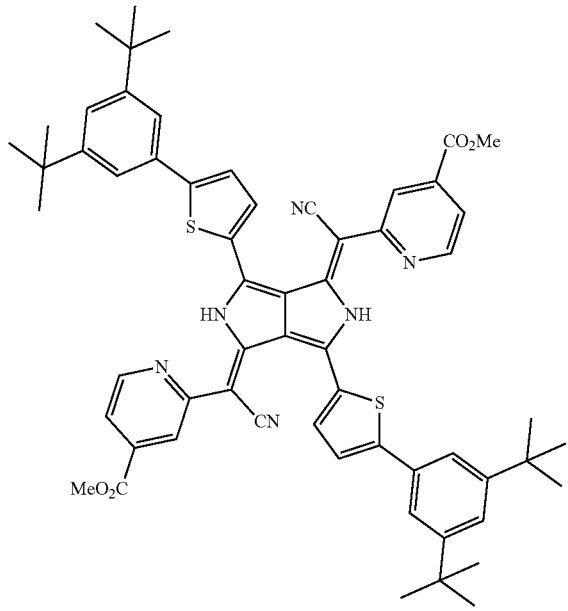 [SMILES: COC(=O)c1ccnc(/C(C#N)=c2\[nH]c(-c3ccc(-c4cc(C(C)(C)C)cc(C(C)(C)C)c4)s3)c3/c(=C(\C#N)c4cc(C(=O)OC)ccn4)[nH]c(-c4ccc(-c5cc(C(C)(C)C)cc(C(C)(C)C)c5)s4)c23)c1]

DPP-2 (0.150 g, 0.222 mmol) and p1 (0.10 g, 0.055 mmol, 2.5 eq) were heated to reflux in absolute toluene under argon. Phosphoryl chloride (0.17 mL, 1.78 mmol, 8 eq) was then added. The reaction was monitored by thin-layer chromatography. As soon as DPP-2 was used up or the concentration of by-products increased, the reaction was quenched with water and extracted 3 times with ethyl acetate. The organic layer was dried over magnesium sulfate and solvents were evaporated. The crude product was treated with methanol in an ultrasonic bath. The solid was collected by filtration and washed with methanol until the filtrate was colorless to afford the desired compound as a dark green solid (0.093 g, 43%).

MW (g·mol$^{-1}$): 993.30.

NMR ($^1$H, CDCl3, 300 MHz) δ (ppm): 13.76 (s, 2H), 8.71 (d, $^3$J=5.22 Hz, 2H), 7.83 (s, 2H), 7.75 (d, $^4$J=1.64 Hz, 8H), 7.50 (d, $^4$J=1.91 Hz, 4H), 7.48 (d, $^4$J=1.44 Hz, 2H), 7.46 (t, $^4$J=1.88 Hz, 2H), 3.93 (s, 6H), 1.38 (s, 36H).

NMR ($^{13}$C, CDCl$_3$, 300 MHz) δ (ppm): 149.6, 148.3, 133.9, 133, 132.8, 131.1, 131, 130, 129.9, 129.5, 128.1, 126.6, 126.4, 126.2, 125.9, 122.8, 121.0, 118.5, 107.9, 32.8, 28.9.

HRMS (ES+) m/z: [M+Na]+ calculated for C$_{60}$H$_{60}$N$_6$O$_4$S$_2$Na: 1015.4015. found: 1015.3998. Δ=−1.7 ppm.

4. Preparation of Intermediate Compound PPcv-th-3

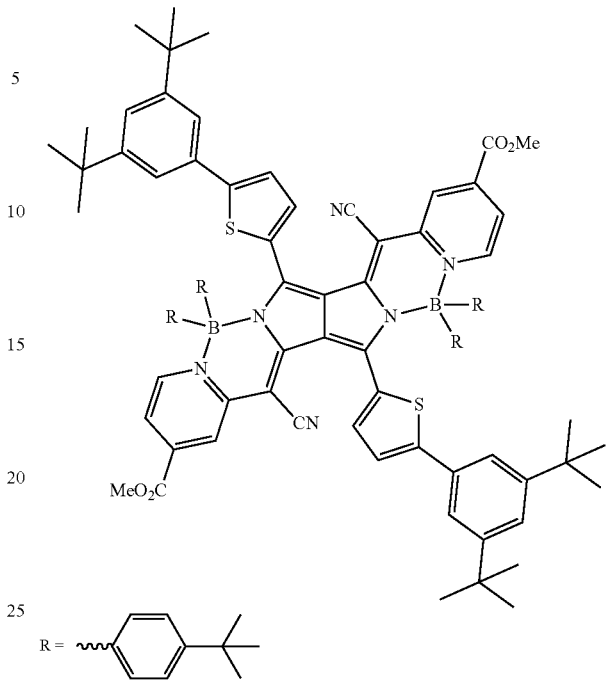

Under argon atmosphere, PPcy-th (0.035 g, 0.035 mmol,) and N,N-diisopropylethylamine (0.100 mL, 0.353 mmol, 10 eq) were heated to reflux in dry dichloromethane. Bis(4-(tert-butyl)phenyl)chloroborane (0.1 mL) was added dropwise and the mixture was heated to reflux for 10 min. The reaction mixture was quenched with water, extracted three times with dichloromethane and dried over MgSO$_4$. After removing the solvent, the crude product was purified by column chromatography using DCM/EP (7:3) as eluent to afford the desired compound as a purple solid (0.006 g, 11%).

MW (g·mol$^{-1}$): 1544.82

NMR ($^1$H, CDCl3, 300 MHz) δ (ppm): 8.12 (d, $^3$J=6.59 Hz, 2H), 7.96 (d, $^4$J=1.23 Hz, 2H), 7.30 (t, $^4$J=1.71 Hz, 2H), 7.26 (m, 4H), 7.17 (q, $^3$J=3.64 Hz, 16H), 6.80 (d, $^3$J=3.78 Hz, 2H), 6.76 (d, $^3$J=8.84 Hz, 2H), 6.25 (d, $^3$J=3.77 Hz, 2H), 3.80 (s, 6H), 1.31 (s, 36H), 1.29 (s, 36H).

HRMS (ASAP−) m/z: [M]− calculated for C$_{100}$H$_{110}$N$_6$O$_4$S$_2$$^{10}$B$_2$: 1542.8289. found: 1542.8281. Δ=−0.5 ppm.

5. Preparation of S3

PPcy-th-3 (0.006, 0.004 mmol) was stirred at room temperature in THF (5 mL). A solution of LiOH (0.002 g, 0.078 mmol, 20 eq) in water (1 mL) is added dropwise in the reaction mixture and stirred for 1 h. Aqueous hydrochloric acid preparation (2M) was added slowly until pH=4. The remaining solution is extracted 3 times with ethyl acetate. After evaporation, the crude product was dissolved in DCM and EP was added. The resulting precipitate was collected by filtration and washed with EP to afford the desired compound as a purple solid (0.004 g, 69%).

MW (g·mol$^{-1}$): 1517.70

NMR ($^1$H, CDCl3, 300 MHz) δ (ppm): 8.11 (d, $^3$J=6.50 Hz, 2H), 7.98 (s, 2H), 7.28 (t, $^4$J=1.70 Hz, 2H), 7.24 (d, $^4$J=1.76 Hz, 4H), 7.17 (q, $^3$J=6.68 Hz, 18H), 6.79 (d, $^3$J=3.77 Hz, 2H), 6.25 (d, $^3$J=3.75 Hz, 2H), 1.31 (s, 36H), 1.21 (s, 36H)

HRMS (ASAP−) m/z: [M]− calculated for C$_{98}$H$_{106}$N$_6$O$_4$S2$^{10}$B$_2$: 1514.7976. found: 1514.8020. Δ=2.9 ppm.

Example 4: Preparation of Sensitizer S4

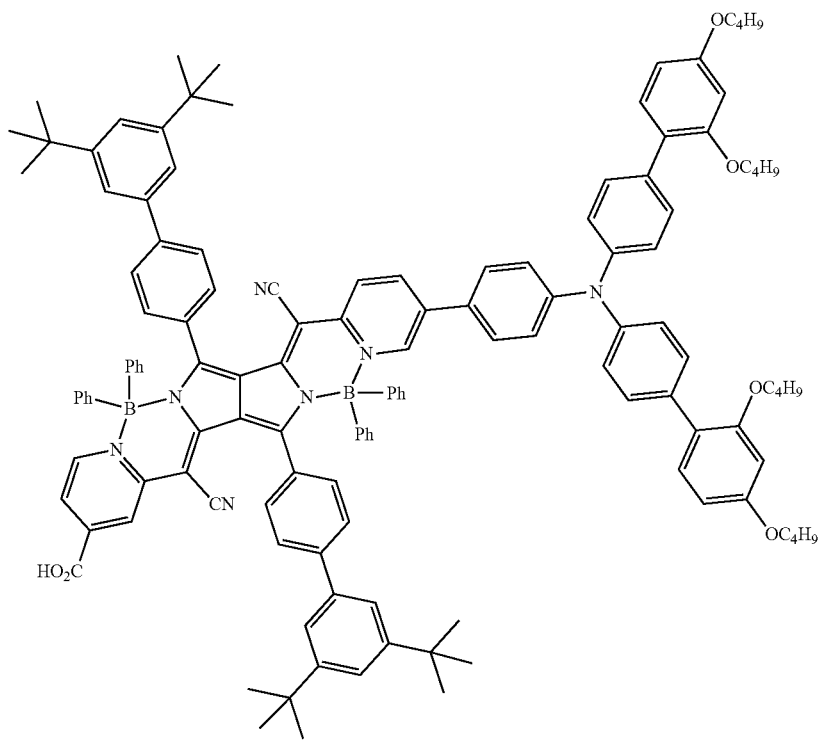

1. Preparation of Intermediate Compound As-PPcy-1
1.1. Preparation of As-DPP-1

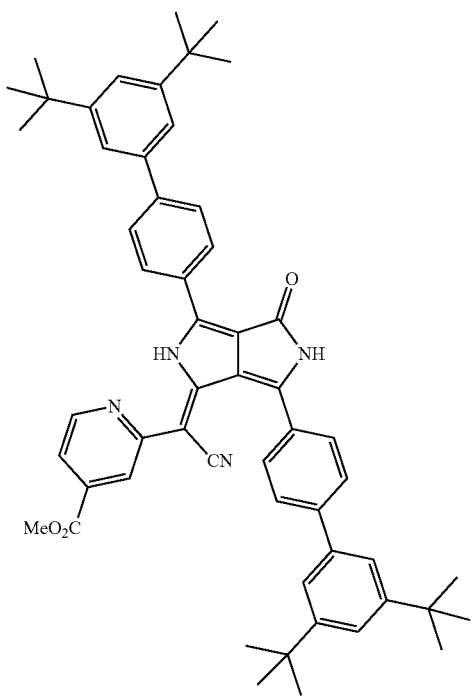 [SMILES: COC(=O)c1ccnc(/C(C#N)=c2\[nH]c(-c3ccc(-c4cc(C(C)(C)C)cc(C(C)(C)C)c4)cc3)c3c2=C(c2ccc(-c4cc(C(C)(C)C)cc(C(C)(C)C)c4)cc2)NC3=O)c1]

DPP-1 (0.200 g, 0.301 mmol) were refluxed in 1 mL POCl$_3$ for 3 h. The POCl$_3$ was distilled off and the residue was dried on vacuum. p1 (0.110 mg, 0.602 mmol, 2 eq) dissolved in 10 ml of abs. THF were added and the mixture was heated to reflux for 1 h. After cooling to room temperature, water was added and extracted 3 times with dichloromethane. The organic layer was dried over magnesium sulfate and solvents were evaporated. The crude product was treated with methanol in an ultrasonic bath and then filtrated on membrane and washed with methanol until the filtrate was colorless. The resulting blue product (0.139 mg, 56%) was pure enough for further reactions.

MW (g·mol$^{-1}$): 823.09

NMR ($^1$H, CDCl$_3$, 300 MHz) δ (ppm): 13.87 (s, 1H), 8.77 (d, $^3$J=5.08 Hz, 1H), 8.45 (d, $^3$J=8.45 Hz, 2H), 8.23 (s, 1H), 7.85 (q, $^3$J=5.56 Hz, 4H), 7.74 (s, 1H), 7.65 (dd, $^3$J=6.81 Hz, $^4$J=1.54 Hz, 4H), 7.51 (dd, $^3$J=3.15 Hz, $^4$J=1.71 Hz, 4H), 7.46 (d, $^3$J=3.53 Hz, 2H), 3.95 (s, 3H), 1.41 (s, 16H), 1.39 (s, 16H)

HRMS (ES+) m/z: [M–H]+ calculated for C$_{55}$H$_{59}$N$_4$O$_3$S: 823.4587. found: 823.4589. Δ=0.2 ppm.

1.2. Preparation of As-PPcy-H-1

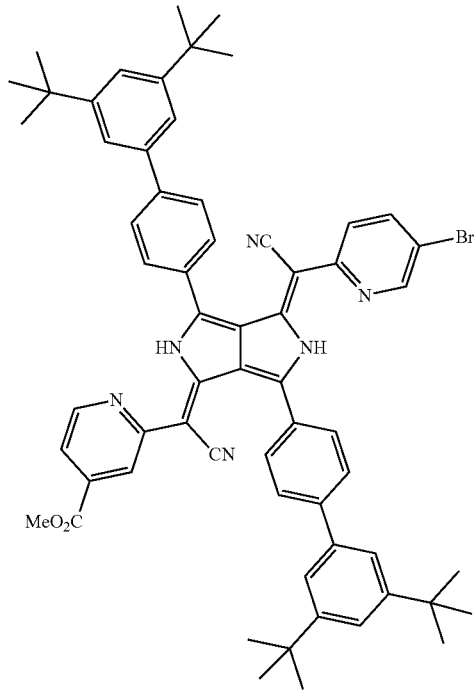 [SMILES: COC(=O)c1ccnc(/C(C#N)=c2\[nH]c(-c3ccc(-c4cc(C(C)(C)C)cc(C(C)(C)C)c4)cc3)c3/c(=C(\C#N)c4ccc(Br)cn4)[nH]c(-c4ccc(-c5cc(C(C)(C)C)cc(C(C)(C)C)c5)cc4)c23)c1]

As-DPP-1 (0.080 g, 0.097 mmol) and 2-(5-Bromopyridin-2-yl)acetonitrile (0.023 g, 0.117 mmol, 1.2 eq) were heated to reflux in absolute toluene under argon. Phosphoryl chloride (0.05 mL, 0.486 mmol, 5 eq) was then added. The reaction was monitored by thin-layer chromatography. As soon as As-DPP-1 was fully consumed or the concentration of by-products increased, the reaction was quenched with water and extracted 3 times with ethyl acetate. The organic layer was dried over magnesium sulfate and solvents were evaporated. The crude product was treated with methanol in an ultrasonic bath. The solid was collected by filtration and washed with methanol until the filtrate was colorless to afford the desired compound as a green solid (0.076 g, 78%).

MW (g·mol$^{-1}$): 1002.11

NMR ($^1$H, CDCl3, 400 MHz) δ (ppm): 13.50 (s, 1H), 13.20 (s, 1H), 8.60 (dd, $^3$J=5.17 Hz, $^4$J=0.74 Hz, 1H), 8.54 (dd, $^4$J=2.40 Hz, $^4$J=0.64 Hz, 1H), 7.94 (s, 1H), 7.76 (qd, $^3$J=8.75 Hz, $^4$J=1.90 Hz, 8H), 7.62 (dd, $^3$J=8.64 Hz, $^4$J=2.37 Hz, 1H), 7.51 (dd, $^4$J=2.44 Hz, $^4$J=1.68 Hz, 5H), 7.47 (t, $^4$J=1.72 Hz, 2H), 7.27 (d, $^3$J=8.48 Hz, 1H), 3.95 (s, 3H), 1.39 (s, 18H), 1.38 (s, 18H)

NMR ($^{13}$C, CDCl3, 100 MHz) δ (ppm): 165.2, 156.4, 153.8, 151.2, 148.4, 148.2, 144.9, 144.8, 139.5, 139.2, 138.0, 130.2, 127.9, 126.7, 122.13, 121.7, 120.4, 117.7, 115.0, 52.7, 35.0, 31.5

HRMS (ES-) m/z: [M] calculated for $C_{62}H_{60}N_6O_2{}^{79}Br$: 999.3961. found: 999.3951. Δ=1.0 ppm.

1.3. Preparation of As-PPcy-1

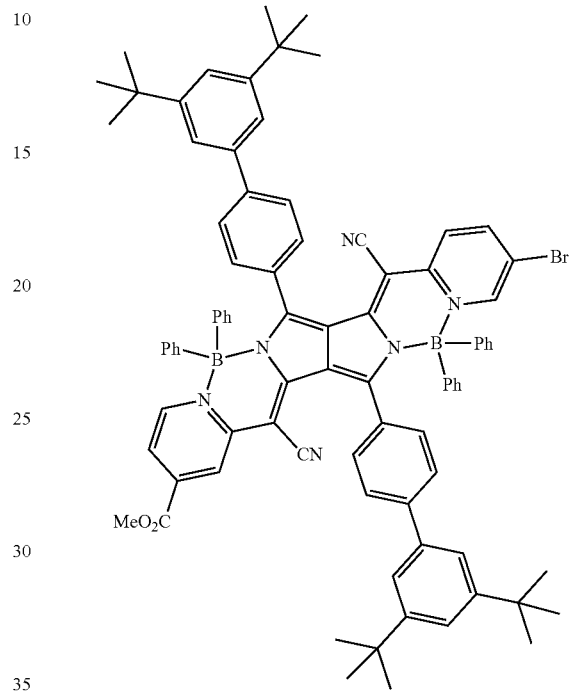

Under argon atmosphere, As-PPcy-H-1 (0.066 g, 0.082 mmol,) and N,N-diisopropylethylamine (0.110 mL, 0.659 mmol, 10 eq) were heated to reflux in dry dichloromethane. Chloro(diphenyl)borane (0.1 mL) was added dropwise and the mixture was heated to reflux for 10 min. The reaction mixture was then quenched with water, extracted three times with dichloromethane and dried over MgSO$_4$. After removing the solvent, the crude product was purified by column chromatography using petrol ether/CH$_2$Cl$_2$ (3/7) as eluent to afford the desired compound as a dark green solid (0.044 g, 50%).

MW (g·mol$^{-1}$): 1330.14.

NMR ($^1$H, CDCl3, 400 MHz) δ (ppm): 7.92 (d, $^3$J=6.05 Hz, 1H), 7.89 (d, $_4$J=1.77 Hz, 2H), 7.55 (dd, $^3$J=6.92 Hz, $^4$J=2.16 Hz, 1H), 7.42 (d, $^4$J=0.86 Hz, 2H), 7.36 (dd, $^3$J=10.29 Hz, $^4$J=1.52 Hz, 4H), 7.25 (d, $^3$J=9.08 Hz, 1H), 7.17 (m, 20H), 7.08 (dd, $^3$J=8.32 Hz, $^3$J=9.84 Hz, 4H), 6.84 (dd, $^3$J=8.36 Hz, $^4$J=3.20 Hz, 4H), 3.81 (s, 3H), 1.41 (s, 18H), 1.40 (s, 18H).

NMR ($^{13}$C, CDCl3, 100 MHz) δ (ppm): 163.5, 156.4, 155.9, 150.9, 150.8, 148.7, 145.7, 145.5, 144.9, 144.7, 142.7, 142.5, 142.1, 140.3, 140.1, 139.7, 133.8, 133.7, 130.4, 129.7, 129.7, 127.6, 127.5, 126.6, 126.4, 125.6, 125.6, 122.3, 122.2, 122.1, 121.8, 121.5, 121.4, 116.8, 116.3, 112.7, 34.9, 31.5.

HRMS (ASAP-) m/z: [M]- calculated for $C_{86}H_{79}{}^{10}B_2N_6O_2{}^{79}Br$: 1326.5707. found: 1326.5734. Δ=2.0 ppm.

2. Preparation of Intermediate Compound HD-1

2.1. Preparation of HD-1″

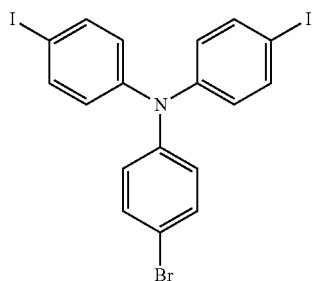 [SMILES: Brc1ccc(N(c2ccc(I)cc2)c2ccc(I)cc2)cc1]

In a sealable tube, 4-Bromotriphenylamine (1 g, 3.08 mmol), KIO$_3$ (0.442 g, 2.06 mmol, 0.7 eq), and KI (0.696 g, 4.19 mmol, 1.36 eq) were placed under argon atmosphere, dissolved in AcOH (16 mL) and heated at 85° C. overnight. The reaction mixture was quenched using saturated solution of Na$_2$S$_2$O$_3$ and stirred for 1 h at room temperature. The solution was extracted 3 times with dichloromethane, dried over magnesium sulfate and solvents are removed under reduce pressure. The crude was purified by column chromatography using petrol ether/CH$_2$Cl$_2$ (9/1) as eluent to afford the final pure product as white crystals (1.4 g, 80%).

MW (g·mol$^{-1}$): 576.01.

NMR ($^1$H, CDCl3, 400 MHz) δ (ppm): 7.53 (d, $^3$J=8.86 Hz, 4H), 7.35 (d, $^3$J=8.90 Hz, 2H), 6.92 (d, $^3$J=8.88 Hz, 2H), 6.80 (d, $^3$J=8.85 Hz, 4H).

2.2. Preparation of HD-1'

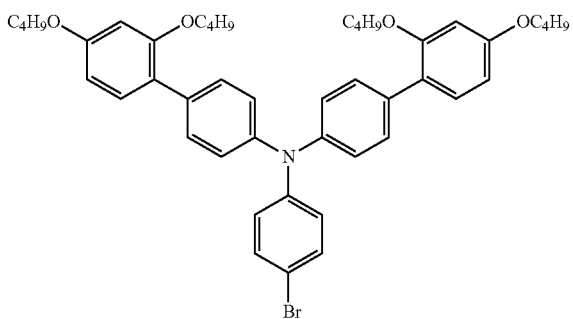

In a sealable tube, HD-1″ (1 g, 1.74 mmol), 2,4-Dibutoxyphenylboronic Acid (1.02 g, 3.82 mmol, 2.2 eq), and K$_2$CO$_3$ (1.19 g, 8.70 mmol, 5 eq) were placed under argon atmosphere and dissolved in toluene (20 mL) and water (6 mL). The solution was degassed 30 minutes under argon in an ultrasonic bath and Pd(PPh$_3$)$_4$ (0.4 g, 0.348 mmol, 0.2 eq) was added. The reaction mixture was heated overnight at 65° C. The reaction was cooled to room temperature, quenched with water, extracted 3 times with ethyl acetate, dried over magnesium sulfate and solvents are removed under reduce pressure. The crude was purified by column chromatography using petrol ether/CH$_2$Cl$_2$ (9/1) as eluent to afford the final pure product as white solid (0.580 g, 44%).

MW (g·mol$^{-1}$): 764.85.

NMR ($^1$H, CDCl3, 400 MHz) δ (ppm): 7.44 (d, $^3$J=8.67 Hz, 4H), 7.33 (d, $^3$J=8.88 is Hz, 2H), 7.23 (d, $^3$J=8.82 Hz, 2H), 7.12 (d, $^3$J=8.64 Hz, 4H), 7.04 (d, $^3$J=8.85 Hz, 2H), 6.54 (m, 4H), 3.97 (m, 8H), 1.75 (m, 8H), 1.41 (m, 8H), 0.94 (m, 12H).

2.3. Preparation of HD-1

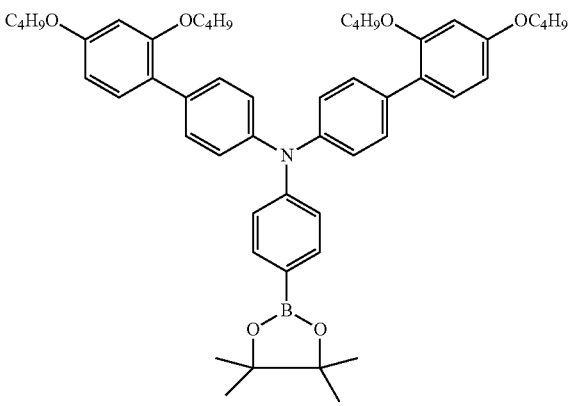

In a sealable tube, HD-1' (0.580 g, 0.760 mmol, bis(pinacolato)diboron (0.212 g, 0.836 mmol, 1.1 eq), potassium acetate (0.223 g, 2.28 mmol, 3 eq) and Pd(dppf)Cl$_2$ (0,028 g, 0.038 mmol, 0.05 eq) were placed under argon atmosphere and dissolved in dry DMF (10 mL). The reaction mixture was heated overnight at 80° C. The reaction was cooled to room temperature, quenched with water, extracted three times with ethyl acetate, dried over magnesium sulfate and solvents were removed under reduce pressure. The crude was purified by column chromatography using petrol ether/CH$_2$Cl$_2$ (1/1) as eluent to afford the final product as white solid (0.554 g, 90%).

MW (g·mol$^{-1}$): 811.91.

NMR ($^1$H, CDCl3, 300 MHz) δ (ppm): 7.67 (d, $^3$J=8.59 Hz, 2H), 7.42 (d, $^3$J=8.72 Hz, 4H), 7.26 (d, $^3$J=8.56 Hz, 2H), 7.14 (d, $^3$J=8.69 Hz, 4H), 7.12 (d, $^3$J=8.58 Hz, 2H), 6.54 (m, 4H), 3.97 (m, 8H), 1.75 (m, 8H), 1.41 (m, 8H), 1.36 (s, 12H), 0.94 (m, 12H).

3. Preparation of Intermediate Compound As-PPcy-HD-1

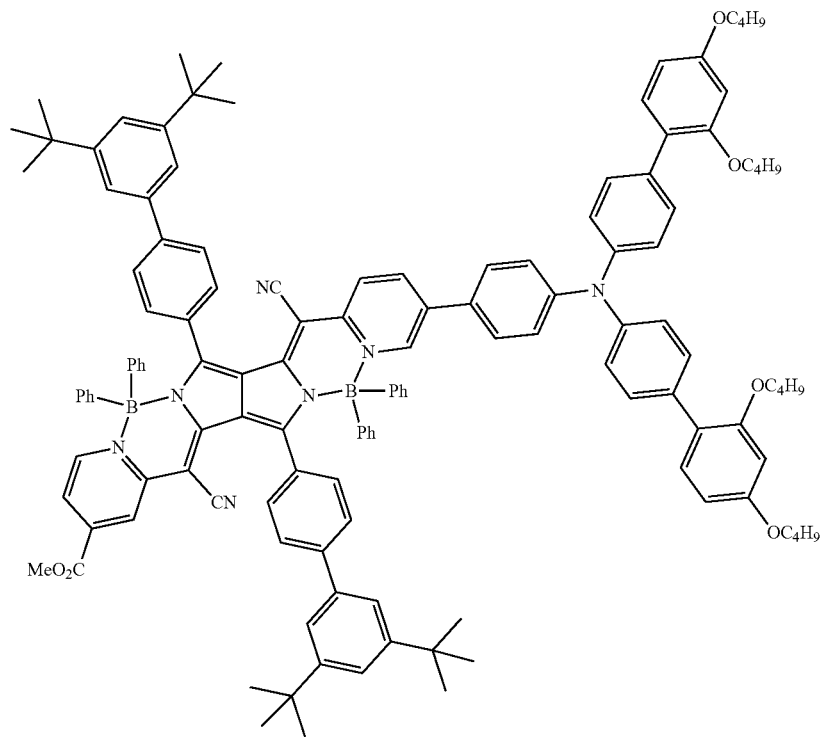

In a sealable tube, As-PPcy-1 (0.015 g, 0.013 mmol), HD-1 (0.018 g, 0.026 mmol, 2 eq), and $K_2CO_3$ (0.007 g, 0.056 mmol, 5 eq) were placed under argon atmosphere and dissolved in toluene (3 mL) and water (1 mL). The solution was degassed 30 minutes under argon in an ultrasonic bath and $Pd(PPh_3)_4$ (0.002 g, 0.001 mmol, 0.1 eq) was added. The reaction mixture was heated overnight at 85° C. The reaction was cooled to room temperature, quenched with water, extracted 3 times with dichloromethane, dried over magnesium sulfate and solvents are removed under reduce pressure. The crude was first purified by column chromatography using petrol ether/$CH_2Cl_2$ (9/1) as eluent and then by recycling HPLC to afford the final pure product as a brown-green solid (0.009 g, 41%).

MW (g·mol$^{-1}$): 1935.18.

NMR ($^1$H, CDCl3, 300 MHz) δ (ppm): 7.41 (m, 7H), 7.35 (m, 5H), 7.23 (d, $^3J$=9.00 Hz), 7.16 (s, 20H), 7.08 (m, 9H), 6.85 (d, $^3J$=7.22 Hz, 4H), 6.53 (m, 4H), 3.96 (m, 8H), 3.79 (s, 3H), 1.73 (m, 8H), 1.52 (m, 8H), 1.41 (s, 18H), 1.39 (s, 18H), 0.94 (m, 12H).

NMR ($^{13}$C, CDCl3, 75 MHz) δ (ppm): 159.6, 150.8, 133.8, 127.5, 126.3, 125.6, 121.5, 105.3, 100.4, 68.1, 67.7, 34.9, 31.5, 31.3, 31.1, 19.2, 13.8, 13.8.

HRMS (ES+) m/z: [M+Na]+ calculated for $C_{132}H_{133}{}^{10}B_2N_7O_6Na$: 1955.0474. found: 1955.0444. Δ=−1.5 ppm.

4. Preparation of S4

As-PPcy-HD-1 (0.008, 0.004 mmol) was stirred at room temperature in THF (5 mL). A solution of LiOH (0.002 g, 0.083 mmol, 20 eq) in water (1 mL) was added dropwise in the reaction mixture and stirred for 1 h. Aqueous hydrochloric acid preparation (2M) is added slowly until pH=4. The remaining solution is extracted 3 times with ethyl acetate. After evaporation, the crude product was dissolved in DCM and EP was added. The resulting precipitate was collected by filtration and washed with EP to afford the desired compound as a brown-green solid (0.006 g, 76%).

MW (g·mol$^{-1}$): 1921.15.

NMR ($^1$H, CDCl3, 400 MHz) δ (ppm): 7.41 (m, 7H), 7.35 (m, 5H), 7.23 (d,), 7.16 (s, 20H), 7.08 (m, 9H), 6.85 (d, 4H), 6.53 (m, 4H), 3.96 (m, 8H), 3.79 (s, 3H), 1.73 (m, 8H), 1.52 (m, 8H), 1.41 (s, 18H), 1.39 (s, 18H), 0.94 (m, 12H).

HRMS (ES−) m/z: [M−H]− calculated for $C_{131}H_{130}N_7O_6{}^{10}B_2$: 1917.0341. found: 1917.0300. Δ=−2.1 ppm.

Example 5: Preparation of Sensitizer S5

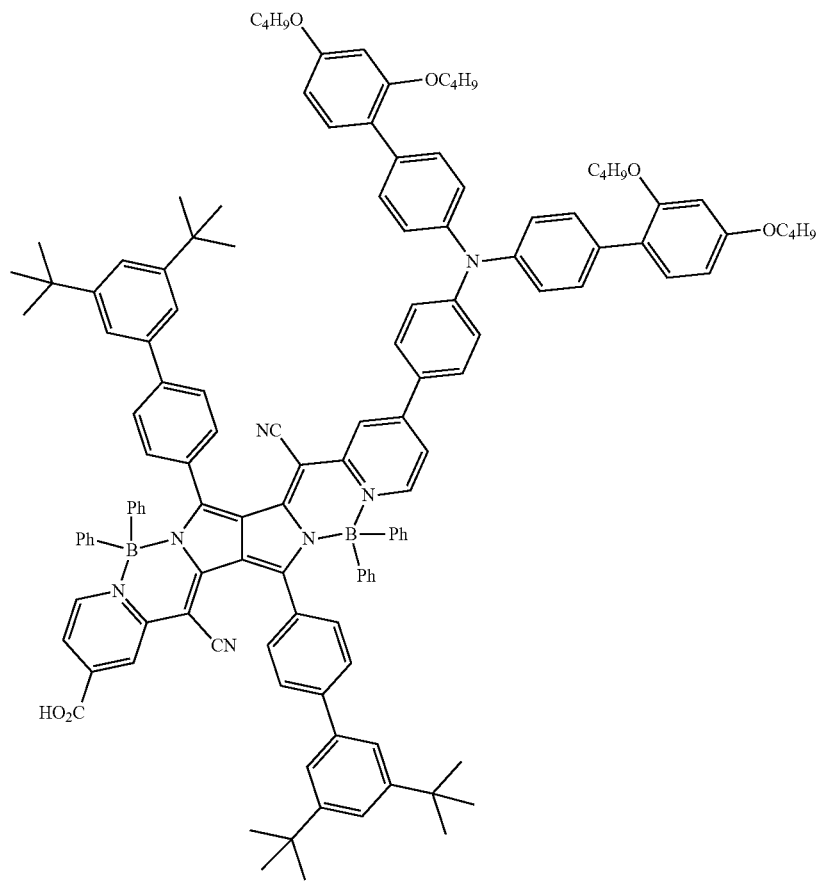

1. Synthesis of Intermediate p2

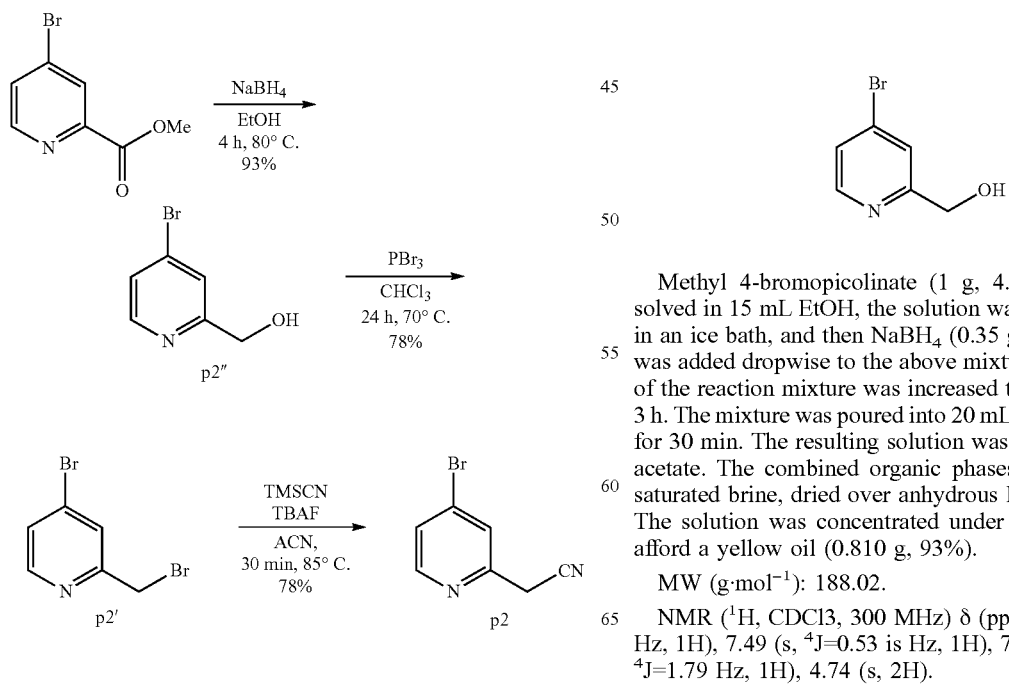

1.1. Preparation of compound p2″

Methyl 4-bromopicolinate (1 g, 4.63 mmol) was dissolved in 15 mL EtOH, the solution was cooled to 0-10° C. in an ice bath, and then NaBH$_4$ (0.35 g, 9.26 mmol, 2 eq)) was added dropwise to the above mixture. The temperature of the reaction mixture was increased to 60° C. and left for 3 h. The mixture was poured into 20 mL ice water and stirred for 30 min. The resulting solution was extracted with ethyl acetate. The combined organic phases were washed with saturated brine, dried over anhydrous MgSO$_4$, and filtered. The solution was concentrated under reduced pressure to afford a yellow oil (0.810 g, 93%).

MW (g·mol$^{-1}$): 188.02.

NMR ($^1$H, CDCl3, 300 MHz) δ (ppm): 8.37 (d, $^3$J=5.33 Hz, 1H), 7.49 (s, $^4$J=0.53 is Hz, 1H), 7.38 (dd, $^3$J=5.32 Hz, $^4$J=1.79 Hz, 1H), 4.74 (s, 2H).

1.2. Preparation of Compound p2'

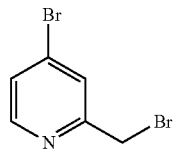

PBr$_3$ (10.0 mL, 105.28 mmol) in 20 mL CHCl$_3$ was added dropwise to the solution of p2" (3.60 g, 16.51 mmol) in 100 mL CHCl$_3$. The reaction mixture was heated under reflux for 6 h. The resulting solution was mixed with 150 mL ice water and the pH was adjusted to 10 with potassium carbonate. The resulting solution was extracted with dichloromethane. The combined organic phases were washed with brine, dried over Na$_2$SO$_4$, filtered, and concentrated under reduced pressure to afford a white solid (5.28 g, 78%).

MW (g·mol$^{-1}$): 250.92.

NMR ($^1$H, CDCl3, 300 MHz) δ (ppm): 8.38 (d, $^3$J=5.33 Hz, 1H), 7.62 (d, $^4$J=1.49 Hz, 1H), 7.38 (dd, $^3$J=5.32 Hz, $^4$J=1.79 Hz, 1H), 4.49 (s, 2H).

1.3. Preparation of Compound p2

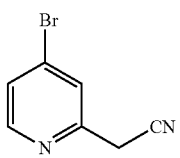

Under argon atmosphere, p$^{2'}$ (2.5 g, 13.5 mmol) is dissolved in dry acetonitrile (250 mL) and stirred at room temperature. TMSCN (2.53 mL, 20.2 mmol, 1.5 eq) and TBAF (20.2 mL, 20.2 mmol, 1.5 eq) were added and the reaction mixture heated 30 minutes at reflux. Solvents were evaporated. The resulting solid was solubilized in AcOEt and washed 4 times with brine The organic layer was dried over magnesium sulfate and solvents were evaporated. A brown oil (2.29 g, 96%) was obtained without further purification.

MW (g·mol$^{-1}$): 197.04.

NMR ($^1$H, CDCl3, 400 MHz) δ (ppm): 8.41 (d, $^3$J=5.33 Hz, 1H), 7.63 (d, $^4$J=1.75 Hz, 1H), 7.38 (dd, $^3$J=5.31 Hz, $^4$J=1.81 Hz, 1H), 4.49 (s, 2H).

NMR ($^{13}$C, CDCl3, 100 MHz) δ (ppm): 151.8, 150.6, 134.0, 126.5, 125.7, 116.2, 26.2893.

HRMS (ASAP+) m/z: [M+H]+ calculated for C$_7$H6N$_2$Br: 196.9714. found: 196.9721. Δ=3.6 ppm.

2. Preparation of Intermediate As-PPcy-2

2.1. Preparation of As-PPcy-H-2

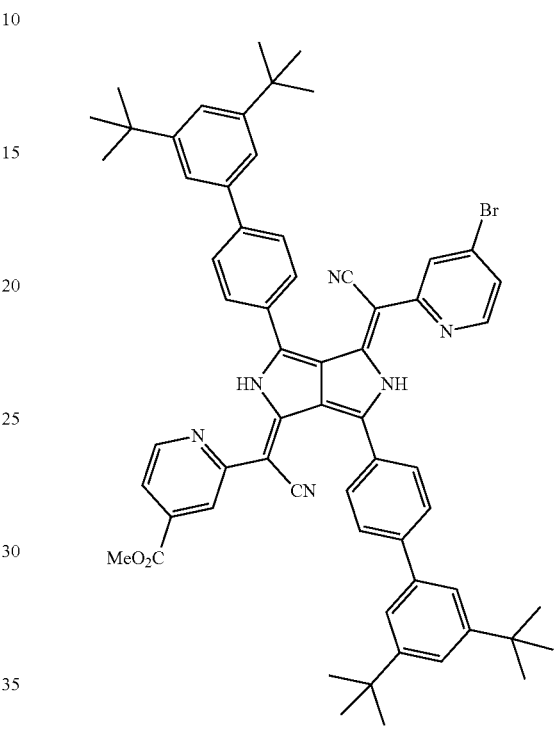

As-DPP-1 (0.065 g, 0.078 mmol) and p2 (0.018 g, 0.095 mmol, 1.2 eq) were heated to reflux in absolute toluene under argon. Phosphoryl chloride (0.04 mL, 0.395 mmol, 5 eq) was then added. The reaction was monitored by thin-layer chromatography. As soon as As-DPP-1 was fully consumed or the concentration of by-products increased, the reaction was quenched with water and extracted 3 times with ethyl acetate. The organic layer was dried over magnesium sulfate and solvents were evaporated. The crude product was treated with methanol in an ultrasonic bath. The solid was collected by filtration and washed with methanol until the filtrate was colorless to afford the desired compound as a blue-green solid (0.034 g, 43%).

MW (g·mol$^{-1}$): 1002.11.

NMR ($^1$H, CDCl3, 400 MHz) δ (ppm): 13.51 (m, 2H), 8.62 (d, $^3$J=5.28 Hz, 1H), 8.28 (d, $^3$J=5.35 Hz, 1H), 7.90 (s, 1H), 7.76 (q, $^3$J=7.88 Hz, 8H), 7.54 (dd, $^3$J=9.32 Hz, $^4$J=1.23 Hz, 2H), 7.50 (t, $^4$J=1.91 Hz, 4H), 7.47 (m, 2H), 7.13 (d, $^3$J=7.44 Hz, $^4$J=1.68 Hz, 1H), 3.94 (s, 3H), 1.38 (s, 18H), 1.37 (s, 18H).

NMR ($^{13}$C, CDCl3, 100 MHz) δ (ppm): 151.2, 130.3, 126.7, 122.1, 121.6, 35.0, 31.5425.

HRMS (ES−) m/z: [M] calculated for C$_{62}$H$_{60}$N$_6$O$_2$$^{79}$Br: 999.3961. found: 999.3961. Δ=0.0 ppm.

2.2. Preparation of As-PPcy-2

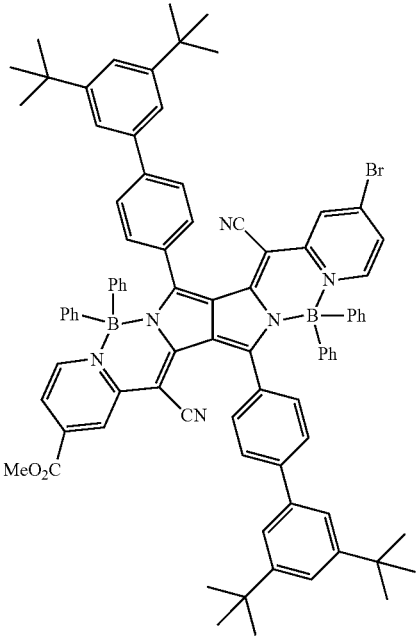

Under argon atmosphere, As-PPcy-H-2 (0.035 g, 0.035 mmol,) and N,N-diisopropylethylamine (0.060 mL, 0.350 mmol, 10 eq) were heated to reflux in dry dichloromethane. Chloro(diphenyl)borane (0.1 mL) was added dropwise and the mixture was heated to reflux for 10 min. The reaction mixture was then quenched with water, extracted three times with dichloromethane and dried over MgSO$_4$. After removing the solvent, the crude product was purified by column chromatography using petrol ether/CH$_2$Cl$_2$ (3/7) as eluent to afford the desired compound as a dark green solid (0.022 g, 47%).

MW (g·mol$^{-1}$): 1330.14.

NMR ($^1$H, CDCl3, 400 MHz) δ (ppm): 7.92 (d, $^3J$=6.05 Hz, 1H), 7.89 (d, $^4J$=1.77 Hz, 2H), 7.64 (d, $^3J$=6.40 Hz, 1H), 7.53 (d, $^4J$=1.6 Hz, 1H), 7.42 (d, $^4J$=0.76 Hz, 2H), 7.36 (m, 4H), 7.20 (dd, $^3J$=5.96 Hz, $^4J$=1.6 Hz, 2H), 7.16 (m, 20H), 7.08 (dd, $^3J$=7.96 Hz, $^4J$=2.64 Hz, 4H), 6.84 (dd, $^3J$=8.48 Hz, $^4J$=1.72 Hz, 4H), 3.81 (s, 3H), 1.41 (s, 18H), 1.40 (s, 18H).

NMR ($^{13}$C, CDCl3, 100 MHz) δ (ppm): 163.5, 156.3, 150.8, 150.7, 150.5, 145.8, 144.9, 144.6, 142.7, 142.6, 140.2, 140.1, 139.7, 136.7, 133.7, 133.7, 130.4, 130.4, 129.7, 129.7, 129.6, 127.6, 126.4, 125.6, 125.5, 123.7, 122.2, 122.1, 121.8, 121.7, 121.4, 116.9, 116.3, 115.2, 34.9.

HRMS (ES+) m/z: [M+Na]+ calculated for C$_{86}$H$_{79}$$^{10}$B$_2$N$_6$O$_2$Na$^{79}$Br: 1349.5604. found: 1349.5614. Δ=0.7 ppm.

3. Preparation of Intermediate As-PPcy-HD-2

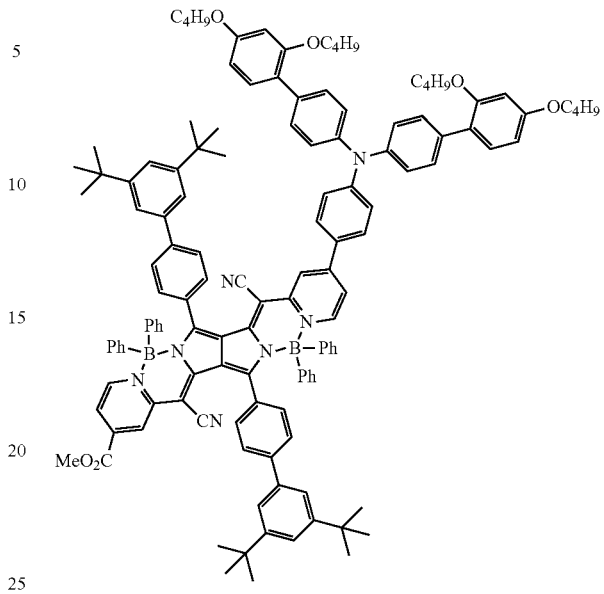

In a sealable tube, As-PPcy-2 (0.022 g, 0.016 mmol), HD-1 (0.027 g, 0.033 mmol, 2 eq), and K$_2$CO$_3$ (0.011 g, 0.085 mmol, 5 eq) were placed under argon atmosphere and dissolved in toluene (3 mL) and water (1 mL). The solution was degassed 30 minutes under argon in an ultrasonic bath and Pd(PPh$_3$)$_4$ (0.004 g, 0.002 mmol, 0.1 eq) was added. The reaction mixture was heated overnight at 85° C. The reaction was cooled to room temperature, quenched with water, extracted 3 times with dichloromethane, dried over magnesium sulfate and solvents are removed under reduce pressure. The crude was first purified by column chromatography using petrol ether/CH$_2$Cl$_2$ (9/1) as eluent and then by recycling HPLC to afford the final pure product as a dark-green solid (0.030 g, 94%).

MW (g·mol$^{-1}$): 1935.18.

NMR ($^1$H, CDCl3, 400 MHz) δ (ppm): 7.84 (m, 3H), 7.56 (d, $^4J$=1.69 Hz, 1H), 7.43 (d, $^3J$=8.48 Hz, 4H), 7.41 (t, $^4J$=2.08 Hz, 2H), 7.39 (m, 2H), 7.36 (dd, $^3J$=8.48 Hz, $^4J$=1.72 Hz, 4H), 7.23 (d, $^3J$=11.2 Hz, 2H), 7.17 (m, 20H), 7.11 (d, $^3J$=8.88 Hz, 6H), 7.08 (m, 3H), 7.06 (d, $^4J$=0.96 Hz, 2H), 6.98 (dd, $^3J$=6.64 Hz, $^4J$=2.24 Hz, 1H), 6.85 (dd, $^3J$=8.32 Hz, J=5.80 Hz, 4H), 6.53 (m, 4H), 3.96 (m, 8H), 3.79 (s, 3H), 1.73 (m, 8H), 1.52 (m, 8H), 1.41 (s, 18H), 1.39 (s, 18H), 0.94 (m, 12H).

NMR ($^{13}$C, CDCl3, 100 MHz) δ (ppm): 159.7, 156.9, 150.8, 150.7, 144.6, 134.4, 133.8, 130.8, 130.4, 127.8, 127.4, 126.9, 126.2, 125.5, 125.4, 124.7, 122.8, 121.5, 105.4, 100.5, 68.1, 67.8, 34.9, 31.5, 31.3, 31.1, 26.9, 19.2.

HRMS (ES+) m/z: [M]+ calculated for C$_{132}$H$_{133}$$^{10}$B$_2$N$_7$O$_6$: 1935.0576. found: 1932.0484. Δ=4.8 ppm.

4. Preparation of S5

As-PPcy-HD-2 (0.030, 0.015 mmol) was stirred at room temperature is in THF (5 mL). A solution of LiOH (0.007 g, 0.310 mmol, 20 eq) in water (1 mL) is added dropwise in the reaction mixture and stirred for 1 h. Aqueous hydrochloric acid preparation (2M) was added slowly until pH=4. The remaining solution was extracted 3 times with ethyl acetate. After evaporation, the crude product was dissolved in DCM and EP was added. The resulting precipitate was collected by filtration and washed with EP to afford the desired compound as a dark green solid (0.027 g, 90%).

MW (g·mol$^{-1}$): 1921.15.

NMR ($^1$H, CDCl3, 400 MHz) δ (ppm): 7.84 (m, 3H), 7.43 (d, $^3$J=8.48 Hz, 4H), 7.41 (t, $^4$J=2.08 Hz, 2H), 7.39 (m, 2H), 7.36 (dd, $^3$J=8.48 Hz, $^4$J=1.72 Hz, 4H), 7.23 (d, $^3$J=11.2 Hz, 2H), 7.17 (m, 20H), 7.11 (d, $^3$J=8.88 Hz, 6H), 7.08 (m, 3H), 7.06 (d, $^4$J=0.96 Hz, 2H), 6.85 (dd, $^3$J=8.32 Hz, J=5.80 Hz, 4H), 6.53 (m, 4H), 3.96 (m, 8H), 1.73 (m, 8H), 1.52 (m, 8H), 1.41 (s, 18H), 1.39 (s, 18H), 0.94 (m, 12H).

HRMS (ES-) m/z: [M]- calculated for $C_{131}H_{130}N_7O_6S_2{}^{10}B_2$: 1917.0341. found: 1917.0352. Δ=0.6 ppm.

Example 6: Preparation of Sensitizer S6

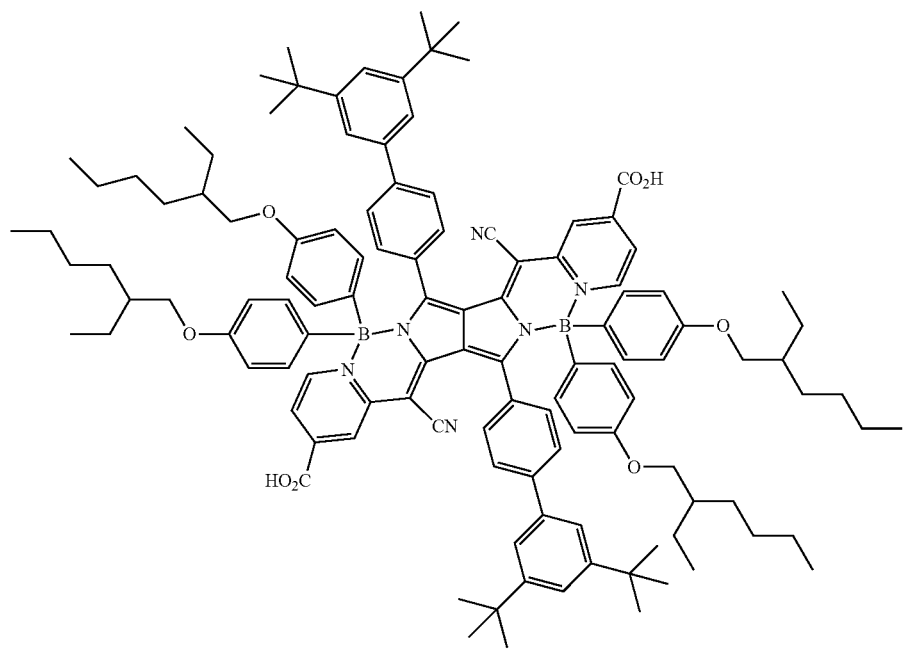

1. Preparation of Intermediate BC-1"

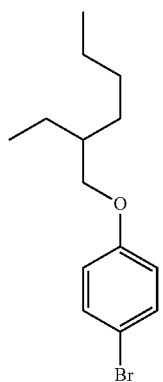

Under a nitrogen atmosphere, 4-bromophenol (2.00 g, 11.56 mmol), KI (0.48 g, 2.89 mmol), 18-crown-6 (0.76 g, 2.89 mmol, 0.25 eq) and K$_2$CO$_3$ (4.00 g, 28.90 mmol, 2.5 eq) were added into 20 mL of dry DMF in a two-neck flask. After stirring for 5 min, 2-ethylhexyl bromide (5.58 g, 28.90 mmol, 2.5 eq) was added via a syringe. The mixture was heated to reflux for 24 h. The cooled mixture was poured into water and then extracted with diethyl ether there times. The combined organic phase was dried over MgSO$_4$. After removing the organic solvents, the residue was purified through a column chromatography on silica gel using a mixture of petrol ether and dichloromethane (9:1) as eluent to give compound BC-1" (3.02 g, 92%) as a colorless oil.

MW (g·mol$^{-1}$): 285.23

NMR ($^1$H, CDCl$_3$, 400 MHz) δ (ppm): 7.53 (d, $^3$J=8.99, 2H), 6.67 (d, $^3$J=9.00 Hz, 2H), 3.80 (d, $^3$J=5.68 Hz, 2H), 1.70 (m, 1H), 1.43 (m, 4H), 1.29 (m, 4H), 0.89 (m, 4H)

2. Preparation of BC-1'

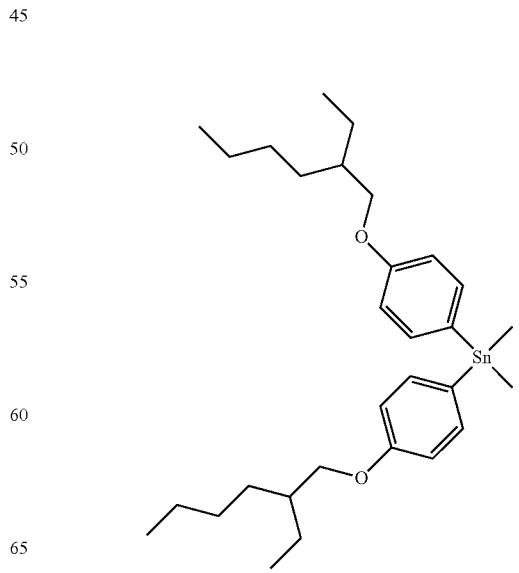

Under an argon atmosphere, BC-1″ (2.00 g, 7.02 mmol) was dissolved in dry THF (8 mL) and cooled to −78° C. in a dry ice/acetone bath. n-BuLi solution in hexane (3.90 mL, 9.82 mmol, 1.4 eq) was added dropwise to the mixture, left 2 h at −78° c. and warm up for additional 2 h at room temperature. The reaction mixture was cooled again at −78)C and $Me_2SnCl_2$ (0.77 g, 3.51 mmol, 0.5 eq) was added. The reaction was stirred at −78° C. for 20 min, and then the bath was removed and the reaction allowed to warm to room temperature and stir overnight. Solvents were removed under reduced pressure and after purification through column chromatography on silica gel (dichloromethane with 1% $Et_3N$ as eluent) and recycling HPLC, a colorless oil was obtained (3.30 g, 84%).

MW (g·mol$^{-1}$): 559.42

NMR ($^1$H, $CDCl_3$, 400 MHz) δ (ppm): 7.41 (d, $^3J$=8.50 Hz, 4H), 6.91 (d, $^3J$=8.52 Hz, 4H), 3.84 (dd, $^3J$=5.56 Hz, $^4J$=1.2 Hz, 4H), 1.72 (m, 2H), 1.44 (m, 8H), 1.31 (m, 8H), 0.91 (m, 12H), 0.45 (s, 6H)

NMR ($^{13}$C, $CDCl_3$, 100 MHz) δ (ppm): 137.2, 114.7, 70.1, 39.3, 30.5, 29.0, 23.8, 23.0, 14.0, 11.1

3. Preparation of BC-1

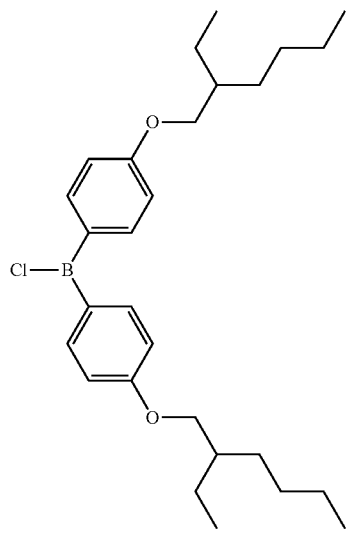 [SMILES: CCCCC(CC)COc1ccc(B(Cl)c2ccc(OCC(CC)CCCC)cc2)cc1]

Under an atmosphere, BC-1′ (0.15 g, 0.27 mmol) was dissolved in 1 mL of dry dichloroethane. A 1 M solution of $BCl_3$ was added dropwise at room temperature and the mixture was heated at 80° C. overnight. After cooling, the solution of BC-1 was used without further purification due to its high instability.

MW (g·mol$^{-1}$): 456.90

4. Preparation of Intermediate PPcy-4

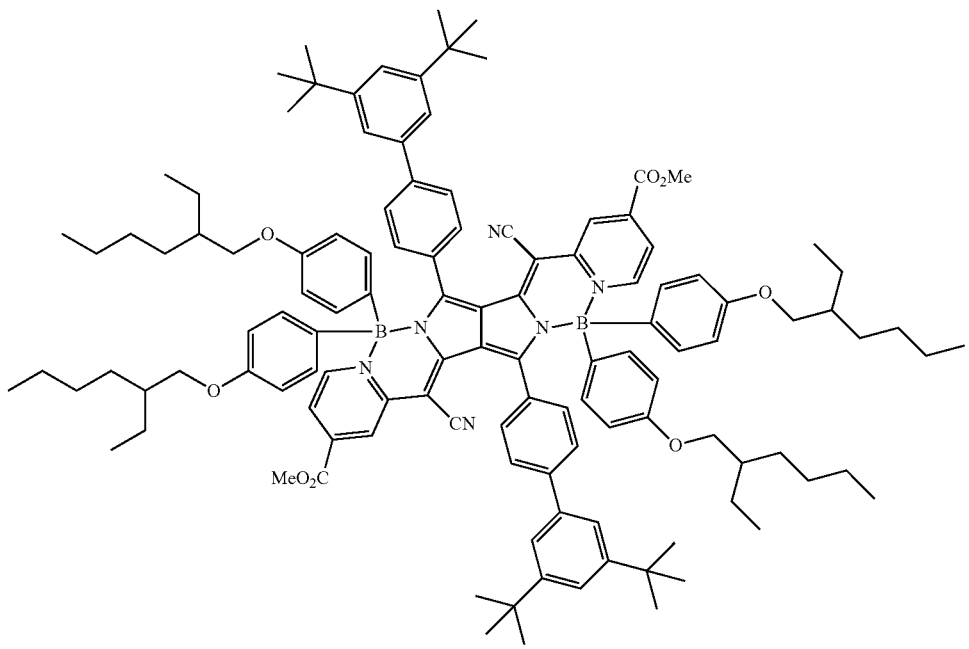

Under argon atmosphere, PPcy (0.060 g, 0.061 mmol,) and N,N-diisopropylethylamine (0.10 mL, 0.605 mmol, 10 eq) were heated to reflux in dry dichloromethane. BC-1 in dichloroethane (0.3 mL) was added dropwise and the mixture was heated to reflux for 10 min. The reaction mixture was quenched with water, extracted three times with dichloromethane and dried over MgSO$_4$. After removing the solvent, the crude product was purified by column chromatography using DCM/EP (7:3) as eluent to is afford the desired compound as a green solid (0.016 g, 15%).

MW (g·mol$^{-1}$): 1821.14

NMR ($^1$H, CDCl$_3$, 400 MHz) δ (ppm): 7.99 (d, $^3$J=6.60 Hz, 2H), 7.87 (d, $^4$J=1.19 Hz, 2H), 7.38 (m, 6H), 7.17 (dd, $^3$J=6.60 Hz, $^4$J=1.74 Hz, 2H), 7.14 (d, $^3$J=8.28 Hz, 4H), 7.02 (d, $^3$J=8.23 Hz, 8H), 6.82 (d, $^3$J=7.56 Hz, 4H), 6.68 (d, $^3$J=8.45 Hz, 8H), 3.80 (s, 6H), 3.71 (m, 8H), 1.67 (m, 4H), 1.38 (s, 36H), 1.30 (m, 30H), 0.89 (m, 26H) HRMS (ES+) m/z: [M]+ calculated for C$_{118}$H$_{141}$$^{10}$B$_2$N$_6$O$_8$: 1819.1461. found: 1819.1399. Δ=−3.4 ppm.

5. Preparation of S6

As-PPcy-HD-3 (0.015 g, 0.008 mmol) was stirred at room temperature in THF (5 mL). A solution of LiOH (0.004 g, 0.16 mmol, 20 eq) in water (1 mL) was added dropwise in the reaction mixture and stirred for 1 h. Aqueous hydrochloric acid preparation (2M) is added slowly until pH=4. The remaining solution is extracted 3 times with ethyl acetate. After evaporation, the crude product was dissolved in DCM and EP was added. The resulting precipitate was collected by filtration and washed with EP to afford the desired compound as a green solid (0.011 g, 74%).

MW (g·mol$^{-1}$): 1793.11

NMR ($^1$H, CDCl$_3$, 400 MHz) δ (ppm): 0.99 (d, $^3$J=6.60 Hz, 2H), 7.87 (d, $^4$J=1.19 Hz, 2H), 7.38 (m, 6H), 7.17 (dd, $^3$J=6.60 Hz, $^4$J=1.74 Hz, 2H), 7.14 (d, $^3$J=8.28 Hz, 4H), 7.02 (d, $^3$J=8.23 Hz, 8H), 6.82 (d, $^3$J=7.56 Hz, 4H), 6.68 (d, $^3$J=8.45 Hz, 8H), 3.71 (m, 8H), 1.67 (m, 4H), 1.38 (s, 36H), 1.30 (m, 30H), 0.89 (m, 26H)

HRMS (ES−) m/z: [M−H]− calculated for C$_{118}$H$_{141}$$^{10}$B$_2$N$_6$O$_8$: 1790.1070. found: 1790.1025. Δ=−2.5 ppm.

Example 7: Preparation of Sensitizer S7

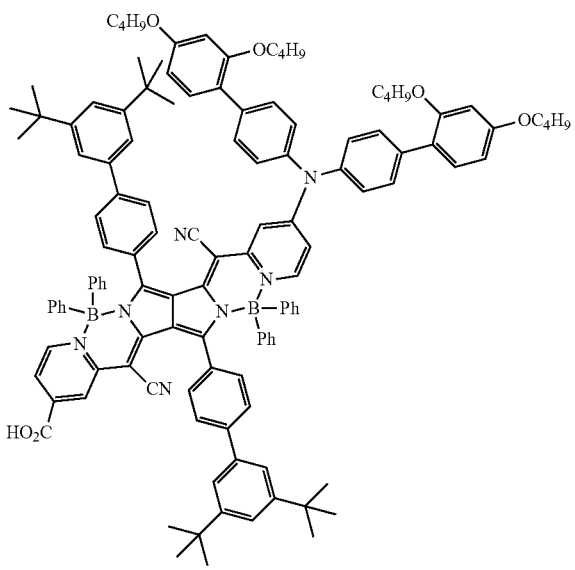

1. Preparation of Intermediate HD-2

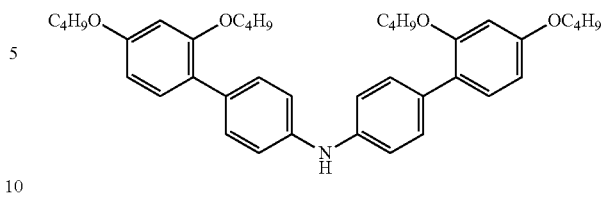

In a sealable tube, bis(4-bromophenyl)amine (1 g, 3.06 mmol), 2,4-Dibutoxyphenylboronic Acid (2.44 g, 9.17 mmol, 3 eq), and K$_2$CO$_3$ (2.00 g, 15.30 mmol, 5 eq) were placed under argon atmosphere and dissolved in toluene (20 mL) and water (6 mL). The solution was degazed 30 minutes under argon in an ultrasonic bath and Pd(PPh$_3$)$_4$ (0.71 g, 0.61 mmol, 0.2 eq) was added. The reaction mixture was heated overnight at 65° C. The reaction is cooled to room temperature, quenched with water, extracted 3 times with ethyl acetate, dried over magnesium sulfate and solvents are removed under reduce pressure. The crude was purified by column chromatography using EP/DCM (6:4) as eluent to afford the final pure product as white solid (1.20 g, %).

MW (g·mol$^{-1}$): 609.85

NMR ($^1$H, CDCl$_3$, 400 MHz) δ (ppm): 7.74 (d, $^3$J=8.70 Hz, 4H), 7.24 (d, $^3$J=8.75 Hz, 2H), 7.11 (d, $^3$J=8.71 Hz, 4H), 6.54 (m, 4H), 4.00 (t, $^3$J=6.56 Hz, 8H), 3.96 (t, $^3$J=6.55 Hz, 4H) 1.76 (m, 8H), 1.49 (m, 8H), 0.99 (t, $^3$J=7.35 Hz, 6H), 0.97 (t, $^3$J=7.32 Hz, 6H)

2. Preparation of Intermediate As-PPcy-HD-3

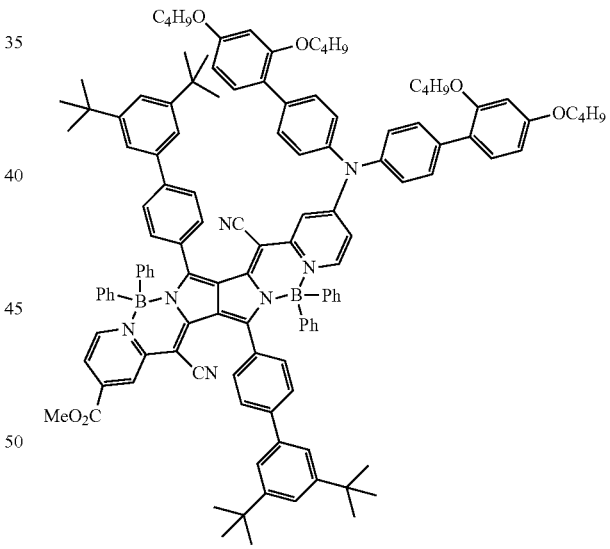

As-PPcy-2 (0.02 g, 0.015 mmol), HD-2 (0.011 g, 0.018 mmol), Na-tBuO (0.007 g, 0.075 mmol, 5 eq), Pd(dba)$_2$ (5 mol-%) (dba=dibenzylideneacetone), tri-tert-butylphosphine tetrafluoroborate (5 mol-%) and 5 mL of dry and degazed toluene were placed in a flask under argon atmosphere. Then the reaction mixture was heated to 80° C. for 24 h. After the reaction mixture had been cooled to room temperature and the mixture was washed with CH$_2$Cl$_2$. After solvent removal, the crude was first purified by column chromatography using petrol ether/CH$_2$Cl$_2$ (7/3) as eluent and then by recycling HPLC to afford the final pure product as a green solid (0.014 g, 50%).

MW (g·mol$^{-1}$): 1859.08

NMR ($^1$H, CDCl$_3$, 300 MHz) δ (ppm): 7.77 (d, $^4$J=1.32 Hz, 1H), 7.74 (d, $^3$J=6.59 Hz, 1H), 7.44 (q, $^3$J=8.46 Hz, 6H), 7.39 (m, 1H), 7.35 (m, 3H), 7.28 (d, $^4$J=1.73 Hz, 2H), 7.14 (d, $^3$J=8.62 Hz, 20H), 7.09 (m, 5H), 7.01 (dd, $^3$J=6.57 Hz, $^4$J=1.71 Hz, 1H), 6.96 (d, $^3$J=8.31 Hz, 2H), 6.92 ($^4$J=2.64 Hz, 1H), 6.80 (dd, $^3$J=8.30 Hz, $^4$J=3.87 Hz, 4H), 6.46 (m, 4H), 6.21 (dd, $^3$J=5.85 Hz, $^4$J=2.65 Hz, 1H), 3.94 (t, $^3$J=6.46 Hz, 4H), 3.84 (t, $^3$J=6.43 Hz, 4H), 3.77 (s, 3H), 1.54 (m, 8H), 1.39 (s, 18H), 1.34 (s, 18H), 0.98 (t, $^3$J=7.31 Hz, 6H), 0.82 (t, $^3$J=7.30 Hz, 6H)

NMR ($^{13}$C, CDCl$_3$, 75 MHz) δ (ppm): 163.9, 159.9, 158.4, 156.8, 154.9, 151.3, 150.7, 150.6, 148.1, 145.7, 144.8, 141.9, 140.9, 140.3, 138.7, 137.4, 133.7, 131.0, 130.8, 130.2, 127.3, 126.0, 125.4, 125.1, 122.0, 121.5, 121.5, 121.1, 116.5, 105.3, 100.3, 68.0, 67.9, 67.7, 52.8, 45.8, 34.9, 34.9, 31.5, 31.5, 31.3, 30.9, 29.7, 19.2, 13.8, 13.7, 9.0

HRMS (ES+) m/z: [M]+ calculated for C$_{126}$H$_{129}$$^{10}$B$_2$N$_7$O$_6$: 1856.0263. found: 1856.0258. Δ=−0.3 ppm 3. Preparation of S5

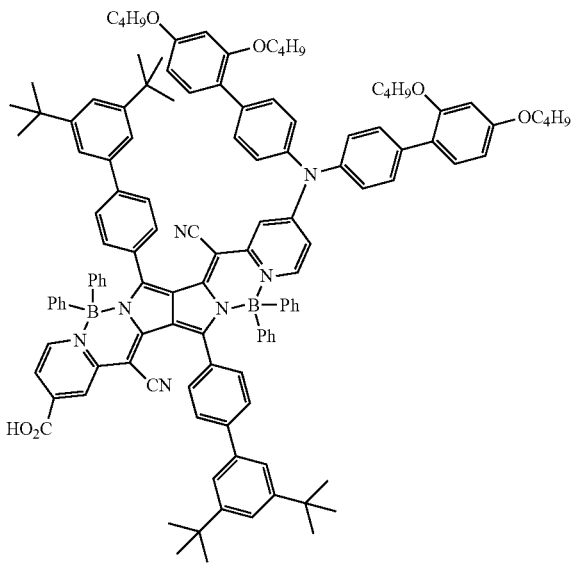

As-PPcy-HD-3 (0.014, 0.007 mmol) was stirred at room temperature is in THF (5 mL). A solution of LiOH (0.004 g, 0.15 mmol, 20 eq) in water (1 mL) was added dropwise in the reaction mixture and stirred for 1 h. Aqueous hydrochloric acid preparation (2M) is added slowly until pH=4. The remaining solution is extracted 3 times with ethyl acetate. After evaporation, the crude product was dissolved in DCM and EP was added. The resulting precipitate was collected by filtration and washed with EP to afford the desired compound as a green solid (0.011 g, 79%).

MW (g·mol$^{-1}$): 1845.05

NMR (1H, CDCl$_3$, 400 MHz) δ (ppm): 7.77 (d, $^4$J=1.32 Hz, 1H), 7.74 (d, $^3$J=6.59 Hz, 1H), 7.44 (q, $^3$J=8.46 Hz, 6H), 7.39 (m, 1H), 7.35 (m, 3H), 7.28 (d, $^4$J=1.73 Hz, 2H), 7.14 (d, $^3$J=8.62 Hz, 20H), 7.09 (m, 5H), 7.01 (dd, $^3$J=6.57 Hz, $^4$J=1.71 Hz, 1H), 6.96 (d, $^3$J=8.31 Hz, 2H), 6.92 ($^4$J=2.64 Hz, 1H), 6.80 (dd, $^3$J=8.30 Hz, $^4$J=3.87 Hz, 4H), 6.46 (m, 4H), 6.21 (dd, $^3$J=5.85 Hz, $^4$J=2.65 Hz, 1H), 3.94 (t, $^3$J=6.46 Hz, 4H), 3.84 (t, $^3$J=6.43 Hz, 4H), 1.54 (m, 8H), 1.39 (s, 18H), 1.34 (s, 18H), 0.98 (t, $^3$J=7.31 Hz, 6H), 0.82 (t, $^3$J=7.30 Hz, 6H)

HRMS (ES+) m/z: [M]+ calculated for C$_{125}$H$_{127}$$^{10}$B$_2$N$_7$O$_6$: 1842.0107. found: 1842.0052. Δ=−3.0 ppm Example 8: Results—Properties of S1-S7

When integrated into devices, this new family of dyes (S1-S7) is able to regenerate at faster half-time speed, ie. nanosecond time-scale, compared to state-of the art sensitizers which are in the range of microsecond time-scale. It has a very slow geminate recombination dynamic which affords in devices to reach quantitative injection yield with a broad range of electrolyte compositions.

The results are shown in FIGS. 1 to 4.

Steady-state absorption spectra were collected with a Analytik Jena UV-visible spectrophotometer using 1-cm-path-length cells. Emission spectra were collected with a FluoroLog emission spectrometer. The optical densities of the samples for emission spectroscopy were below 0.1 and the samples were excited at the wavelength of the maximum absorption band.

1H and 13C NMR spectra were recorded on an AVANCE 300 UltraShield BRUKER. Chemical shifts are referenced relative to residual protium or carbon signal in the deuterated solvent. NMR spectra were recorded at room temperature, chemical shifts are written in ppm and coupling constants in Hz. Mass spectrometry was performed with a JEOL JMS-700 B/E spectrometer.

The spectra of the dyes are dominated by a strong and thin absorption band peaking between 750 and 800 nm depending on the structure of the pyrrolopyrrole cyanines. This feature is particularly valuable for the application in colorless DSSCs because the absorbance is strongly localized on the NIR with low contribution in the visible region to maximize AVT. A comparison of the electronic spectra of dyes S1 and S3 demonstrates the bathochomic shift upon replacing a phenylene by a thiophenylene. In the same vein, introducing a trisarylamine donating group red shifts the absorbance by (dye S1 versus dye S4). All these dyes are strongly fluorescent with emission lifetimes in the range of few nanosecond at room temperature. The latter property indicates that the dye excited state is significantly long-lived to efficiently inject an electron in the conduction band of TiO$_2$.

Example 9: Hydrogen Production Experiments with Dye Sensitized Photocatalytic Systems 1. Preparation of Surface-Platinized TiO$_2$ Nanoparticles by Photodeposition 40 mL methanol was added to 2 g of commercially available TiO$_2$ nanoparticles (Sigma-Aldrich 21 nm particle size) in a quartz round-bottom-flask. A solution of 80 mg of H$_2$PtCl$_6$.6H$_2$O in 1 mL of deionized water is added, and reaction medium is degassed with N$_2$ for 30 min under vigorous stirring, then irradiated 1 h by UV light (100 W). The particles were collected by filtration, washed thoroughly with methanol and then dried in vacuum overnight. The platinum-loading is measured by Atomic Absorption Spectroscopy (AAS) with 50 mg and 100 mg surface-platinized TiO$_2$ nanoparticles 40 min in 5 mL aqua regia (HNO$_3$/HCl: 1/3), centrifuged 30 min at 10 000 rpm, and the supernatant diluted in 20 mL distilled water.

2. Nanoparticles Dye-Loading Determination

The absorbance of 10 mL solution of the dye S1 at 0.1 M in EtOH/CHCl$_3$: 9/1 is measured before 100 mg of surface-platinized TiO$_2$ nanoparticles are added. Then the medium is ultrasonically treated in water 90 min and centrifuged 30 min at 10 000 rpm, the supernatant is replaced by 10 mL EtOH/CHCl$_3$: 9/1 and centrifuged again 10 min at 10 000 rpm. The absorbance of the two supernatants is measured and compared with the absorbance before for a dye-loading approximation. The real dye-loading measure is obtained by desorption of 10 mg nanoparticles in a 3 mL phenylphosphonic acid solution in DMF (20 mg per mL) 1 h at 80° C. The absorbance of the solution is measured.

3. Hydrogen Production and Measurement 5 mL of a solution of Sacrificial Electron Donor (SED: ascorbic acid 0.1 M) basified by NaOH (0.5 M) to reach pH=4 is added with 10 mg of the functionalized nanoparticles in a 6 mL photoreactor. The solution is then degassed with N$_2$ and illuminated with different light sources (1 W LED, artificial AM 1.5 [1000 W/m$^2$] sun, natural sun). The amount of hydrogen produced is measured every hour by sampling the headspace of the cell by and analyzing it by gas chromatography upon integration of the area of H$_2$ peak and using a calibration curve. The gas chromatography column is a BR Molecular sieve 5A, SN: 1029974/BR80280-107 with a FID detector eluted with nitrogen.

Figure 5:
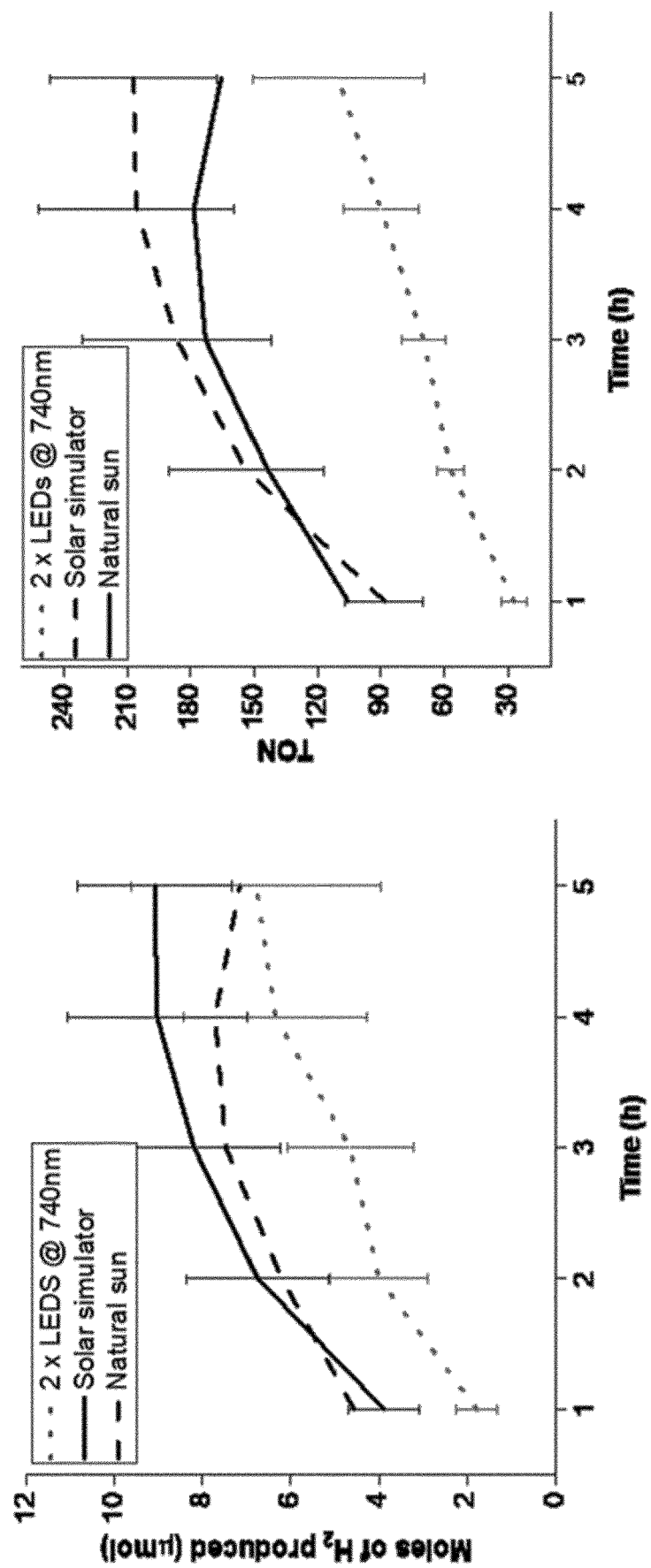
FIG. 5: Quantity of H2 produced (left) and turnover number (right) as a function of the irradiation time.

The results of the photocatalytic production of H$_2$ in DSP sensitized with the dye S1 upon irradiation with simulated sunlight (AM1.5 1000 W/m$^2$) or natural sun or with two 3 Watts LED emitting at 740 nm are gathered in Table 1 and the results are illustrated on FIG. 5.

TABLE 1

Quantity of H$_2$ produced and turnover number (TON) measured after 6 hours of irradiation. Dye loading of S1: 4.68 nmol/mg de TiO$_2$.

| Irradiation conditions | Moles H$_2$ [μmol] | TON [6 h] |
|---|---|---|
| LED @ 740 nm | 7.83 ± 2.6 | 111 ± 23 |
| Artificial sun | 9.09 ± 1.7 | 207 ± 40 |
| Natural sun | 7.15 ± 1.1 | 165 ± 12 |

Clearly, it can be observed that the dye sensitized photocatalytic (DSP) systems based on the pyrrolopyrrole cyanine dye S1 effectively produces H$_2$ even with photons carrying energy as low as 1.6 eV (740 nm). These experiments demonstrate that the pyrrolopyrrole cyanine dyes according to the invention are compatible with H$_2$ production in DSP with NIR energy of sunlight.

The invention claimed is:

1. A compound having the following formula (I):

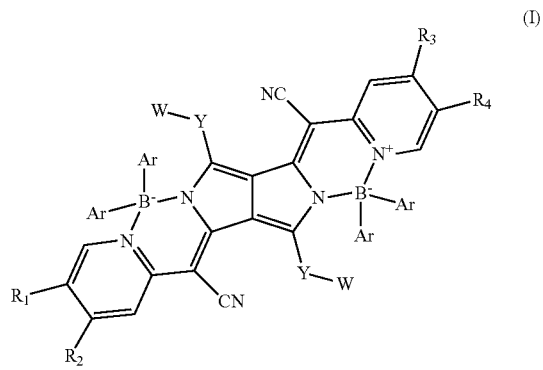

(I)

wherein:
Ar is selected from the group consisting of:
  a phenyl group; and
  a phenyl group substituted with at least one substituent L selected from the group consisting of:
    (C$_1$-C$_{16}$)alkyl groups;
    (C$_1$-C$_{16}$)alkoxy groups; and
    (C$_1$-C$_{16}$)thioalkyl groups;
Y is selected from the group consisting of:
  a phenylene radical; and
  a thiophenylene radical;
  a furanylene radical; and
W is a phenyl group comprising at least one substituent Z, wherein Z is selected from the group consisting of:
  (C$_1$-C$_{12}$)alkyl groups;
  (C$_1$-C$_{12}$)alkoxy groups; and
  di((C$_1$-C$_{12}$)alkyl)amino groups;
R$_1$ is H;
R$_2$ is an anchoring group selected from the group consisting of:
  a —COOH group;
  a —C(=O)—NH(OH) group;
  a —CH=C(CN)(COOH) group; and
  a —PO$_3$H$_2$ group;
R$_3$ is selected from the group consisting of:
  H;
  an anchoring group selected from the group consisting of:
    a —COOH group;
    a —C(=O)—NH(OH) group;
    a —CH=C(CN)(COOH) group; and
    a —PO$_3$H$_2$ group;
  (C$_1$-C$_{16}$)alkyl groups;
  (C$_1$-C$_{16}$)alkoxy groups;
  (C$_1$-C$_{16}$)thioalkyl groups; and
  a group having the following formula (III):

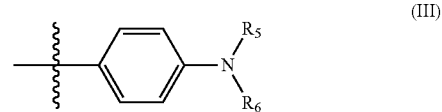

(III)

wherein R$_5$ and R$_6$, identical or different, are selected from the group consisting of:
  (C$_1$-C$_{16}$)alkyl groups;
  a group having the following formula (IV):

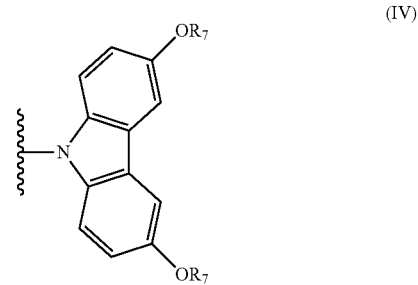

(IV)

$R_7$ being a $(C_1-C_{16})$alkyl group;

a group having the following formula (V):

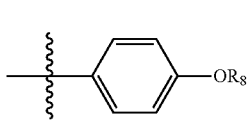

(V)

$R_a$ being a $(C_1-C_{16})$alkyl group;

a group having the following formula (VI):

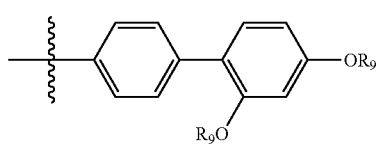

(VI)

$R_9$ being a $(C_1-C_{16})$alkyl group;

a group having the following formula (III-1):

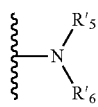

(III-1)

wherein $R'_5$ and $R'_6$, identical or different, are a group having the following formula (VI-1):

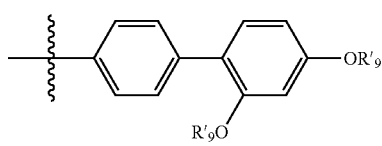

(VI-1)

$R'_9$ being a $(C_1-C_{16})$alkyl group;

$R_4$ is selected from the group consisting of:

H;

$(C_1-C_{16})$alkyl groups;

$(C_1-C_{16})$alkoxy groups;

$(C_1-C_{16})$thioalkyl groups; and a group having the following formula (VII):

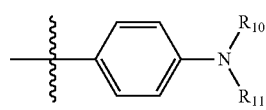

(VII)

wherein $R_{10}$ and $R_{11}$, identical or different, are selected from the group consisting of:

$(C_1-C_{16})$alkyl groups;

a group having the following formula (VIII):

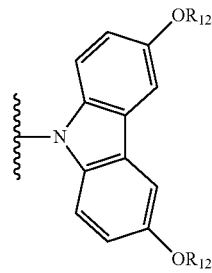

(VIII)

$R_{12}$ being a $(C_1-C_{16})$alkyl group;

a group having the following formula (IX):

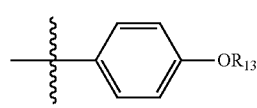

(IX)

$R_{13}$ being a $(C_1-C_{16})$alkyl group;

a group having the following formula (X):

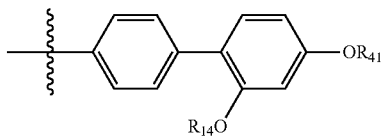

(X)

$R_{14}$ being a $(C_1-C_{16})$alkyl group.

2. The compound having the formula (I) of claim 1, wherein Ar is selected from the group consisting of:

a phenyl group;

a substituted phenyl group comprising one substituent in ortho, meta or para position, having the following formula (1):

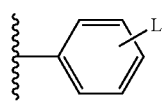

(1)

L being as defined in claim 1;

a substituted phenyl group having the following formula (2):

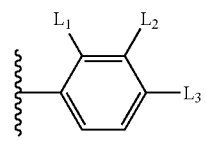

(2)

wherein
L₁ is selected from the group consisting of:
 $(C_1-C_{16})$alkyl groups;
 $(C_1-C_{16})$alkoxy groups; and
 $(C_1-C_{16})$thioalkyl groups;
L₂ is H and L₃ is selected from the group consisting of:
 $(C_1-C_{16})$alkyl groups;
 $(C_1-C_{16})$alkoxy groups; and
 $(C_1-C_{16})$thioalkyl groups;
or L₃ is H and L₂ is selected from the group consisting of:
 $(C_1-C_{16})$alkyl groups;
 $(C_1-C_{16})$alkoxy groups; and
 $(C_1-C_{16})$thioalkyl groups;
a substituted phenyl group having the following formula (3):

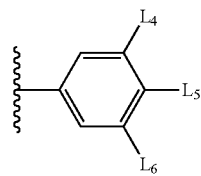

(3)

wherein
L₄ is selected from the group consisting of:
 $(C_1-C_{16})$alkyl groups;
 $(C_1-C_{16})$alkoxy groups; and
 $(C_1-C_{16})$thioalkyl groups;
L₅ is H and L₆ is selected from the group consisting of:
 $(C_1-C_{16})$alkyl groups;
 $(C_1-C_{16})$alkoxy groups; and
 $(C_1-C_{16})$thioalkyl groups;
or L₆ is H and L₅ is selected from the group consisting of:
 $(C_1-C_{16})$alkyl groups;
 $(C_1-C_{16})$alkoxy groups; and
 $(C_1-C_{16})$thioalkyl groups.

3. The compound having the formula (I) of claim 1, wherein Ar is selected from the group consisting of:
a phenyl group;
a substituted phenyl group comprising one substituent in ortho, meta or para position, having the following formula (1):

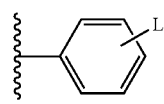

(1)

L being as defined in claim 1;
a substituted phenyl group having the following formula (2):

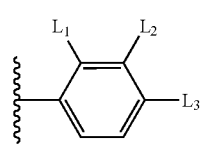

(2)

wherein
L₁ is selected from the group consisting of:
 $(C_1-C_{16})$alkyl groups;
 $(C_1-C_{16})$alkoxy groups; and
 $(C_1-C_{16})$thioalkyl groups;
L₂ is H and L₃ is identical to L₁ or L₃ is H and L₂ is identical to L₁; and
a substituted phenyl group having the following formula (3):

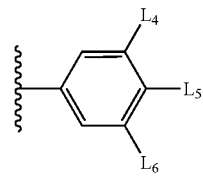

(3)

wherein
L₄ is selected from the group consisting of:
 $(C_1-C_{16})$alkyl groups;
 $(C_1-C_{16})$alkoxy groups; and
 $(C_1-C_{16})$thioalkyl groups; and
L₅ is H and L₆ is identical to L₄ or L₆ is H and L₅ is identical to L₄.

4. The compound having the formula (I) of claim 1, wherein Ar is a phenyl group, a p-tert-butylphenyl group or a phenyl group substituted with an alkoxy group.

5. The compound according to claim 1, having the following formula (II):

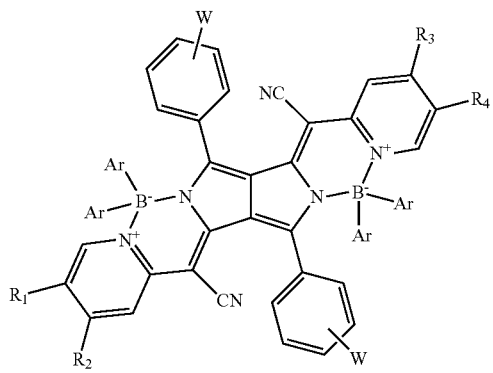

(II)

wherein Ar, R₁, R₂, R₃, R₄, and W are as defined in claim 1.

6. The compound according to claim 1, wherein W is a group having one of the below formulae (4) to (7):

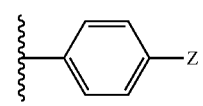

(4)

-continued
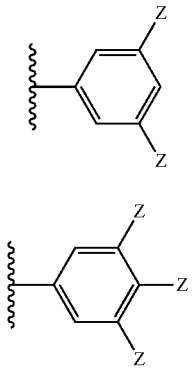
(5)
(6)
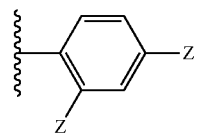
(7)
Z being as defined in claim 1.
7. The compound according to claim 1, wherein $R_2$ is a —COOH group.
8. The compound according to claim 1, wherein $R_1$ and $R_4$ are H, and $R_2$ and $R_3$ are anchoring groups as defined in claim 1.
9. The compound according to claim 1, wherein $R_1$ and $R_4$ are H, and $R_2$ and $R_3$ are —COOH.
10. The compound according to claim 1, having one of the following formulae:
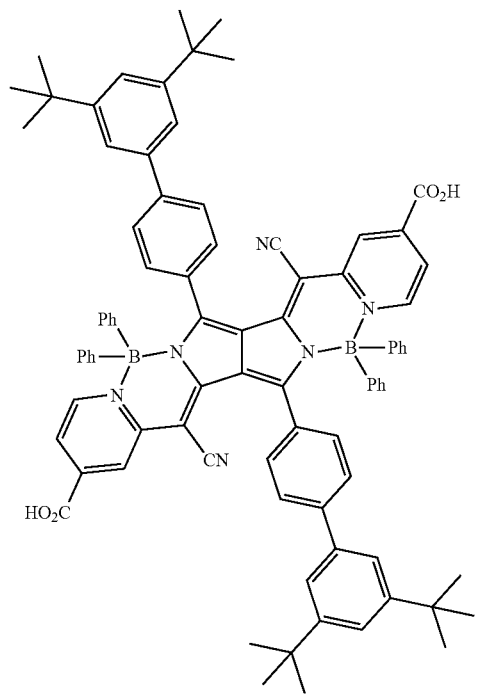
(S1)

(S2)
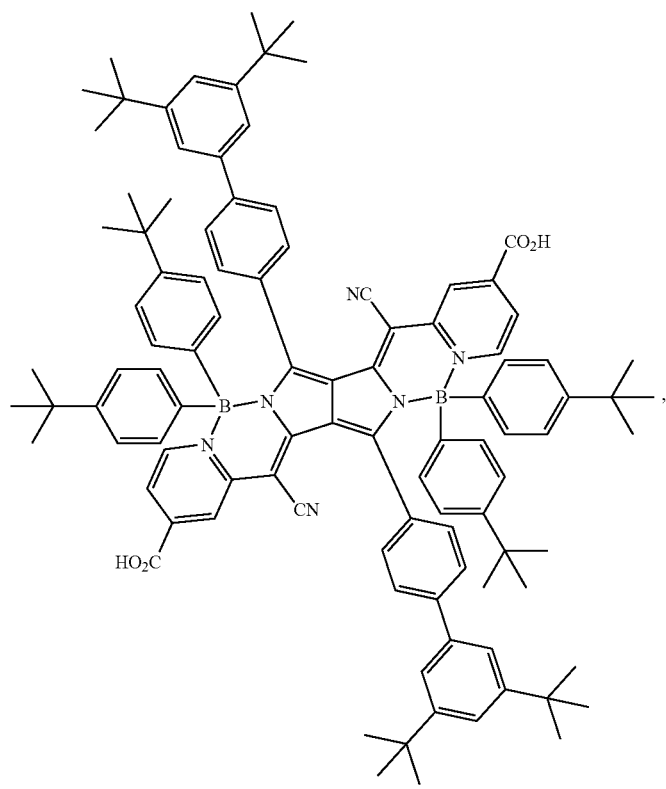
(S3)
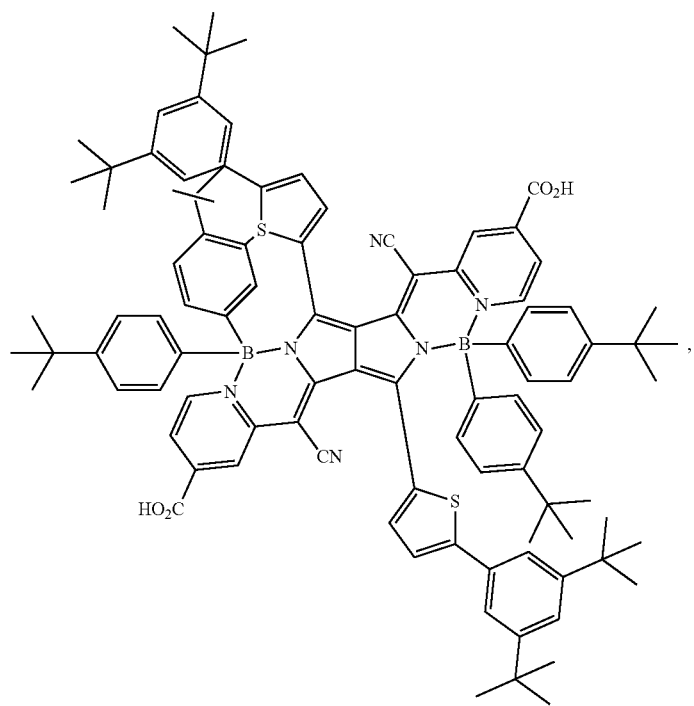

(S4)
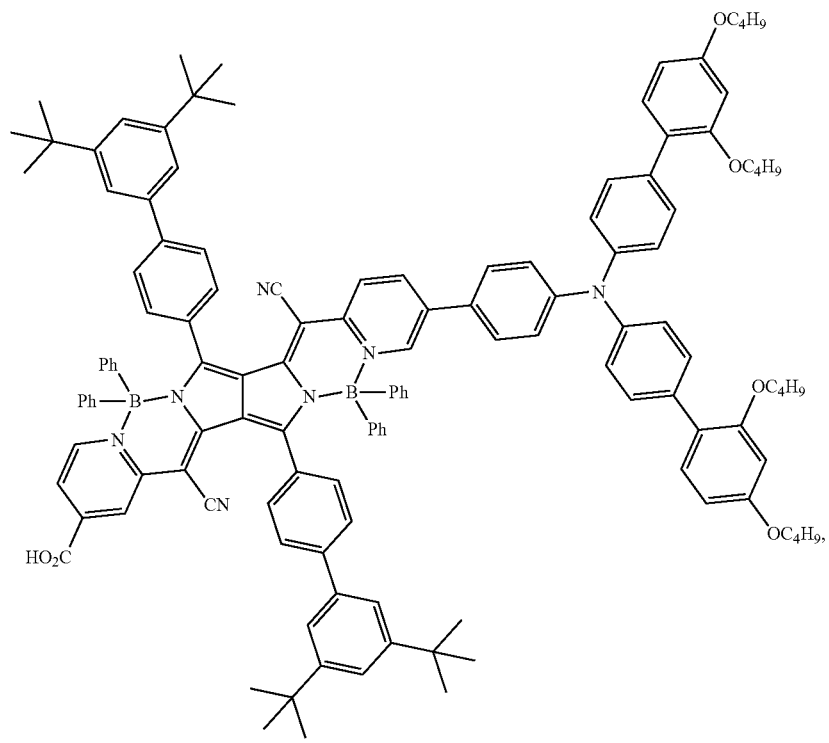
(S5)
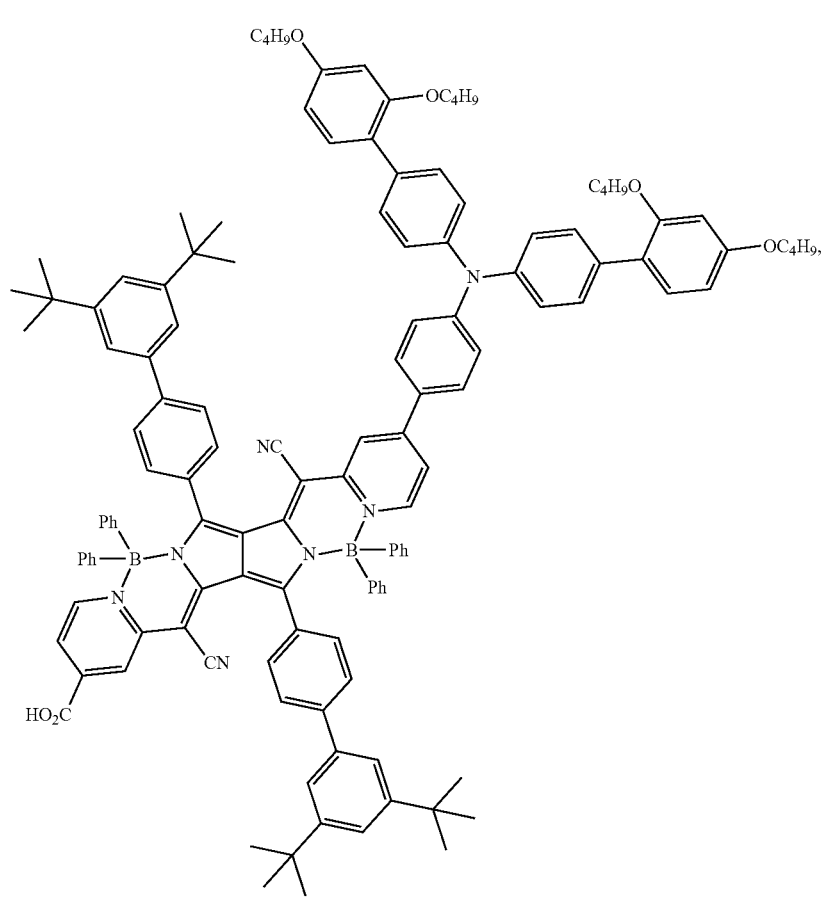

(S6)
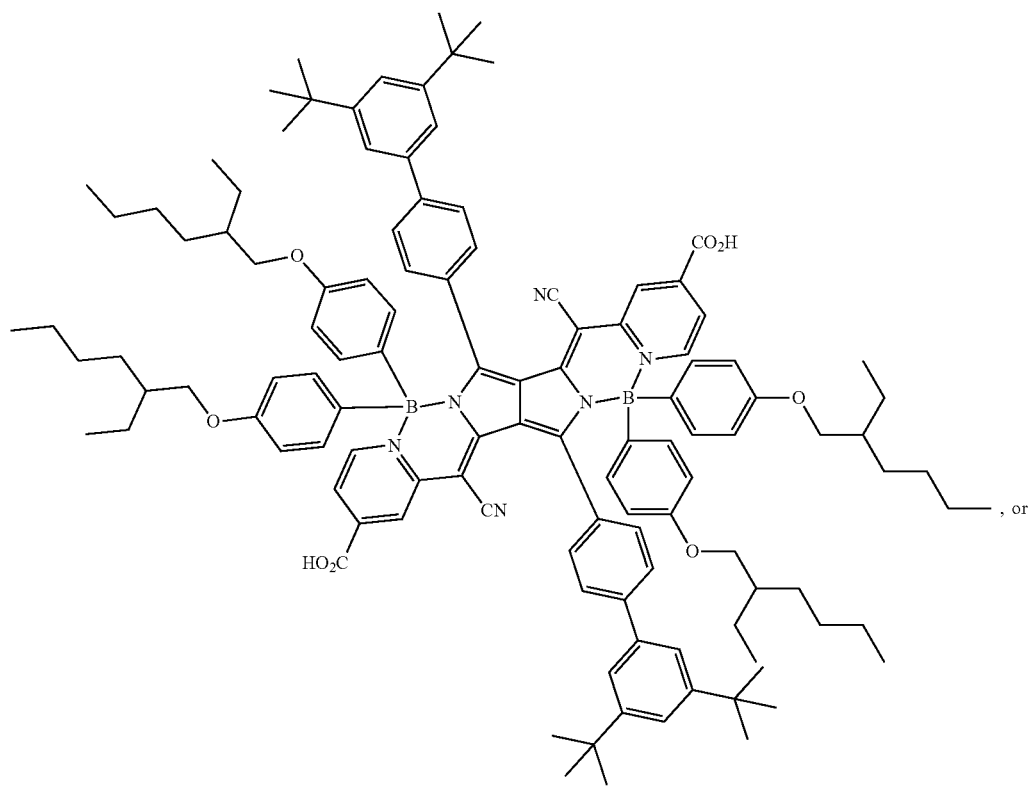
, or
(S7)
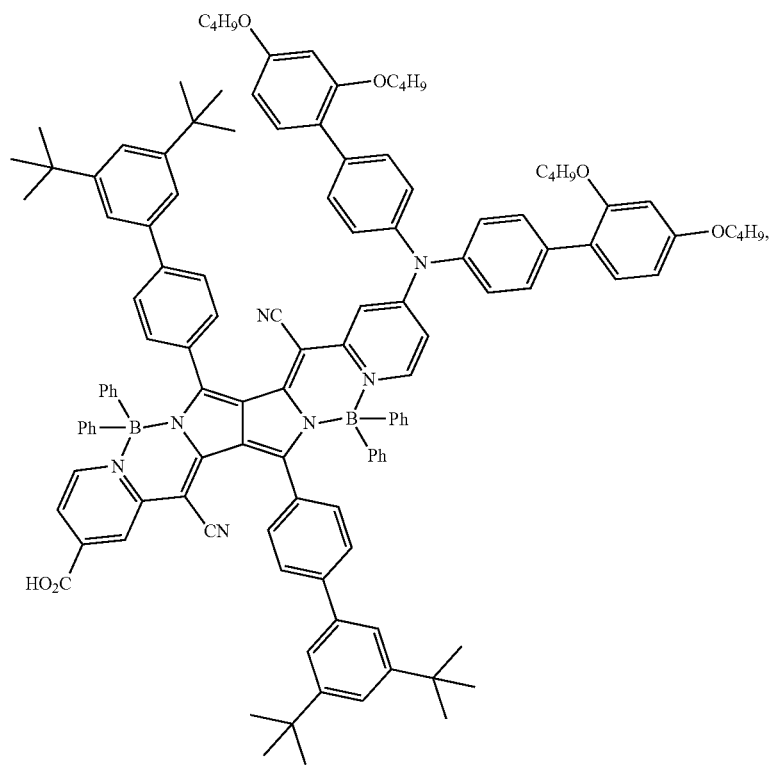

11. A dye sensitized solar cell comprising at least one compound of claim 1 as dye sensitizer.

12. A dye sensitized solar cell comprising at least one said compound of claim 1 as dye sensitizer, the dye sensitized solar cell further comprising at least one further dye, said further dye being identical to or different from the compound of claim 1.

13. A dye sensitizer comprising the compound of claim 1 in dye-sensitized photocatalytic systems (DSPs) for hydrogen production, $CO_2$ reduction, water oxidation, organic compounds activation, or degradation of pollutants.

* * * * *